(12) United States Patent
Fukuda et al.

(10) Patent No.: US 9,660,217 B2
(45) Date of Patent: May 23, 2017

(54) LIGHT EMITTING ELEMENT AND METHOD FOR MAUFACTURING LIGHT EMITTING ELEMENT

(71) Applicant: JX NIPPON OIL & ENERGY CORPORATION, Tokyo (JP)

(72) Inventors: Maki Fukuda, Yokohama (JP); Suzushi Nishimura, Yokohama (JP); Shigetaka Toriyama, Atsugi (JP); Takashi Seki, Yokohama (JP)

(73) Assignee: JX NIPPON OIL & ENERGY CORPORATION, Tokyo (JP)

( * ) Notice: Subject to any disclaimer, the term of this patent is extended or adjusted under 35 U.S.C. 154(b) by 0 days.

(21) Appl. No.: 15/019,280

(22) Filed: Feb. 9, 2016

(65) Prior Publication Data

US 2016/0172624 A1    Jun. 16, 2016

Related U.S. Application Data

(63) Continuation of application No. PCT/JP2014/071142, filed on Aug. 11, 2014.

(30) Foreign Application Priority Data

Aug. 14, 2013 (JP) ................................. 2013-168700

(51) Int. Cl.
*H01L 51/52* (2006.01)

(52) U.S. Cl.
CPC ...... *H01L 51/5253* (2013.01); *H01L 51/5246* (2013.01); *H01L 51/5268* (2013.01)

(58) Field of Classification Search
CPC ............. H01L 51/5253; H01L 51/5268; H01L 51/5246

See application file for complete search history.

(56) References Cited

U.S. PATENT DOCUMENTS

| 5,747,623 A | 5/1998 | Matsuo et al. |
| 6,083,860 A | 7/2000 | Matsuo et al. |

(Continued)

FOREIGN PATENT DOCUMENTS

| JP | H05-238827 A | 9/1993 |
| JP | H06-122852 A | 5/1994 |

(Continued)

OTHER PUBLICATIONS

Oct. 14, 2014 Written Opinion issued in International Patent Application No. PCT/JP2014/071142.

(Continued)

*Primary Examiner* — Michele Fan
(74) *Attorney, Agent, or Firm* — Oliff PLC

(57) ABSTRACT

A light emitting element includes a base member, a sealing member disposed to face the base member, a concave-convex structure layer, a first electrode, an organic layer, a second electrode, and an adhesive layer. The concave-convex structure layer, the first electrode, the organic layer, and the second electrode are formed on the base member in that order. The adhesive layer is positioned between the base member and the sealing member. An outer periphery of the concave-convex structure layer is positioned between an inner periphery and an outer periphery of the adhesive layer. The light emitting element includes the concave-convex structure layer functioning as a diffracting grating, and thus light extraction efficiency thereof is excellent. Further, a light emitting part is sealed with sufficient sealing performance and deterioration of the light emitting part due to moisture and oxygen is prevented. Thus, the light emitting element has a long service life.

9 Claims, 11 Drawing Sheets

(56) References Cited

U.S. PATENT DOCUMENTS

| | | | |
|---|---|---|---|
| 2007/0176548 A1 | 8/2007 | Kim et al. | |
| 2010/0230667 A1* | 9/2010 | Nakamura | H01L 51/5268 257/40 |
| 2012/0132897 A1 | 5/2012 | Seki et al. | |
| 2013/0026461 A1* | 1/2013 | Nakamura | H01L 51/5268 257/40 |
| 2013/0299796 A1 | 11/2013 | Masuyama et al. | |
| 2014/0225098 A1* | 8/2014 | Lee | G02B 5/0268 257/40 |
| 2014/0368107 A1* | 12/2014 | Jung | H05B 33/04 313/504 |
| 2015/0028317 A1* | 1/2015 | Ichihara | H01L 51/5246 257/40 |
| 2015/0034929 A1* | 2/2015 | Ide | H05B 33/06 257/40 |
| 2015/0171362 A1* | 6/2015 | Sato | H01L 51/5203 257/40 |
| 2015/0188088 A1* | 7/2015 | Kubota | H01L 51/5268 257/40 |
| 2015/0270512 A1* | 9/2015 | Yamae | H01L 51/5268 257/40 |
| 2015/0380681 A1* | 12/2015 | Furukawa | H01L 51/5253 257/40 |
| 2016/0155988 A1* | 6/2016 | Kuroki | H01L 51/0097 257/40 |

FOREIGN PATENT DOCUMENTS

| | | |
|---|---|---|
| JP | H06-240208 A | 8/1994 |
| JP | H06-299118 A | 10/1994 |
| JP | H06-306329 A | 11/1994 |
| JP | H07-196986 A | 8/1995 |
| JP | H08-112879 A | 5/1996 |
| JP | 2989064 B2 | 12/1999 |
| JP | 2006-236748 A | 9/2006 |
| JP | 2009-283279 A | 12/2009 |
| JP | 2012-174410 A | 9/2012 |
| JP | 2013-012500 A | 1/2013 |
| WO | 2011/007878 A1 | 1/2011 |
| WO | 2012/096368 A1 | 7/2012 |
| WO | 2013/136771 A1 | 9/2013 |

OTHER PUBLICATIONS

Oct. 14, 2014 Search Report issued in International Patent Application No. PCT/JP2014/071142.

Jul. 20, 2016 Office Action issued in Australian Patent Application No. 2014307433.

Sep. 26, 2016 Office Action issued in Chinese Patent Application No. 201480045127.3.

* cited by examiner

Fig. 11

| EVALUATION ITEMS | | Ex. 1 | Ex. 2 | Ex. 3 | Ex. 4 | Com. Ex. 1 | Com. Ex. 2 | Com. Ex. 3 |
|---|---|---|---|---|---|---|---|---|
| THE NUMBER OF DEFECTIVE ELEMENTS IN ADHESION PROPERTY EVALUATION | | 0 | 0 | 0 | - | 0 | 5 | - |
| THE NUMBER OF DARK SPOTS | INITIAL STATE | 0 | 0 | 0 | 0 | 0 | 0 | 0 |
| | 10 DAYS AFTER | 0 | 0 | 0 | 0 | 3 | 0 | 5 |
| | 20 DAYS AFTER | 0 | 0 | 0 | 0 | 15 | 0 | 20 |

LIGHT EMITTING ELEMENT AND METHOD FOR MAUFACTURING LIGHT EMITTING ELEMENT

CROSS REFERENCE TO RELATED APPLICATION

This application is a continuation application of International Patent Application No. PCT/JP2014/071142 filed on Aug. 11, 2014 claiming the benefit of priority of Japanese Patent Application No. 2013-168700 filed on Aug. 14, 2013. The contents of International Patent Application No. PCT/JP2014/071142 and Japanese Patent Application No. 2013-168700 are incorporated herein by reference in their entities.

BACKGROUND OF THE INVENTION

Field of the Invention

The present invention relates to a light emitting element and a method for manufacturing the light emitting element.

Description of the Related Art

Light emitting elements expected as next-generation of displays or illumination devices include an organic EL element (organic Electro-Luminescence element or organic light emitting diode). In the organic EL element, a hole injected from a hole injecting layer and electron injected from an electron injecting layer are carried to a light emitting layer respectively, then the hole and electron are recombined on an organic molecule in a light emitting part of the light emitting layer to excite the organic molecule, thereby generating light emission. Therefore, when the organic EL element is used as the display device or the illumination device, the light from the light emitting layer is required to be efficiently extracted from the surface of the organic EL element. In order to meet this demand, Japanese Patent Application Laid-open No. 2006-236748 discloses that a diffraction grating substrate is provided on a light extraction surface of the organic EL element.

In the organic EL element, moisture and oxygen may reduce luminance, luminous efficiency, and the like. In order to prevent such deterioration, the organic EL element is used in a state that the light emitting part (organic layer) is sealed with a sealing member. Methods for sealing the light emitting part include a method referred to as "surface sealing (cover sealing)" and a method referred to as "frame sealing". The surface sealing is a method for sealing the light emitting part by covering the light emitting part with adhesive (sealing adhesive) or the like. The frame sealing is a method as described in Japanese Patent Application Laid-open No. 2012-174410. Namely, in a structure having a sealing member, such as sealing glass, which is disposed on a light emitting part on a substrate, the periphery of the sealing member is sealed with adhesive. It is said that it is possible to elongate the service life of the frame-sealed element by filling a sealed space of the structure with a desiccant or the like.

SUMMARY OF THE INVENTION

It is known that the frame sealing performed for the organic EL element having the diffraction grating substrate has the following problem. Namely, moisture and oxygen penetrate through a fine or minute concave-convex layer exposed to the outside of the sealed space, which results in deterioration of the element. Thus, in Japanese Patent Application Laid-open No. 2012-174410, the minute concave-convex layer is positioned within the sealed space. In this method, however, the sealing adhesive adheres not to the surface of the minute concave-convex layer but rather to a flat substrate surface, and thus it is difficult to obtain the adhesive force improving effect which would be otherwise brought about by the surface area increasing effect and the catching effect of the concave-convex surface of the minute concave-convex layer. Having no adhesive force improving effect may lead to insufficient sealing performance to cause the deterioration of the light emitting element, or may lead to insufficient adhesion between the adhesive and the substrate to cause the exfoliation (peeing off) of the adhesive after the sealing. An object of the present invention is to provide a light emitting element which includes a concave-convex structure layer functioning as a diffraction grating and a light emitting part which is sealed by frame sealing (frame-sealed) with sufficient sealing performance, thereby preventing the deterioration of the service life of the light emitting element, and a method for manufacturing the light emitting element.

According to a first aspect of the present invention, there is provided a light emitting element including:
a base member;
a sealing member disposed to face the base member;
a concave-convex structure layer;
a first electrode;
an organic layer;
a second electrode; and
an adhesive layer,
wherein the concave-convex structure layer, the first electrode, the organic layer, and the second electrode are formed on the base member in that order;
the adhesive layer is positioned between the base member and the sealing member; and
an outer periphery of the concave-convex structure layer is positioned between an inner periphery of the adhesive layer and an outer periphery of the adhesive layer.

In the light emitting element, at least one of the first electrode and the second electrode may include an overlapping part overlapping both of the concave-convex structure layer and the adhesive layer. The overlapping part may have a concave-convex surface reflecting or showing concavities and convexities of the concave-convex structure layer. The inner periphery of the adhesive layer may adhere to the concave-convex structure layer or the concave-convex surface reflecting or showing the concavities and convexities of the concave-convex structure layer.

In the light emitting element, the organic layer may be positioned such that a predetermined space is provided between the adhesive layer and the organic layer.

In the light emitting element, the outer periphery of the concave-convex structure layer may be formed as an inclined surface, and an angle between the outer periphery of the concave-convex structure layer and a surface of the base member is not more than 80°.

In the light emitting element, a space, which is sealed by the base member, the sealing member disposed to face the base member, and the adhesive layer, may be filled with infilling.

In the light emitting element, the outer periphery of the concave-convex structure layer may be positioned roughly halfway between the outer periphery and the inner periphery of the adhesive layer sealing the space.

In the light emitting element, the concave-convex structure layer may be made of a sol-gel material.

According to a second aspect of the present invention, there is provided a method for manufacturing a light emitting element, including the steps of:

forming a concave-convex structure layer on a base member;

forming a first electrode on the concave-convex structure layer;

forming an organic layer on the first electrode;

forming a second electrode on the organic layer; and disposing a sealing member to face the base member such that the concave-convex structure layer, the first electrode, the organic layer, and the second electrode, those of which are formed on the base member, are positioned between the base member and the sealing member; and forming an adhesive layer between the base member and the sealing member, wherein the adhesive layer is formed such that an outer periphery of the concave-convex structure layer is positioned between an inner periphery of the adhesive layer and an outer periphery of the adhesive layer.

In the method for manufacturing the light emitting element, it is preferred that the adhesive layer be formed in a position in which the adhesive layer has no contact with the organic layer.

In the method for manufacturing the light emitting element, it is preferred that the concave-convex structure layer be formed such that an angle between the outer periphery of the concave-convex structure layer and a surface of the base member is not more than 80°.

According to a third aspect of the present invention, there is provided a light emitting element including:

a base member;

a sealing member disposed to face the base member;

a first concave-convex structure layer having a first concave-convex pattern;

a second concave-convex structure layer having a second concave-convex pattern;

a first electrode;

an organic layer;

a second electrode; and an adhesive layer, wherein the first concave-convex structure layer and the second concave-convex structure layer, which is positioned with a predetermined distance from the first concave-convex structure layer, are formed on the base member;

a stacked body of the first electrode, the organic layer, and the second electrode is formed on the first concave-convex pattern;

the adhesive layer is formed between the base member and the sealing member to surround the stacked body; and the second concave-convex structure layer is disposed not to penetrate the adhesive layer.

In the light emitting element, the second concave-convex pattern may be different from the first concave-convex pattern. The second concave-convex pattern may be identical to the first concave-convex pattern.

In the light emitting element, a side surface of the second concave-convex structure layer may be formed as an inclined surface, and an angle between the side surface of the second concave-convex structure layer and a surface of the base member is not more than 80°. Further, an outer periphery of the first concave-convex structure layer may be formed as an inclined surface, and an angle between the outer periphery of the first concave-convex structure layer and a surface of the base member is not more than 80°.

The light emitting element of the present invention includes the concave-convex structure layer functioning as a diffraction grating, and thus light extraction efficiency thereof is excellent. Further, a light emitting part is sealed by frame sealing with sufficient sealing performance, and thus deterioration of the organic layer (light emitting part) due to moisture and oxygen is prevented and the light emitting element of the present invention has a long service life. Therefore, the light emitting element of the present invention is very useful in various devices such as displays and illumination devices.

BRIEF DESCRIPTION OF THE DRAWINGS

FIGS. 1A and 1B schematically depict a light emitting element according to an embodiment of the present invention, wherein FIG. 1A is a schematic top view and FIG. 1B is a schematic cross-sectional view as viewed in the I-I direction of FIG. 1A.

FIGS. 6A to 6C each depict a design of an exposure mask for concave-convex structure layer formation, wherein FIG. 6A is a design of an exposure mask used in each of Examples 1 and 3, FIG. 6B is a design of an exposure mask used in Example 2, and FIG. 6C is a design of an exposure mask used in Comparative Example 2.

FIG. 11 is a table showing evaluation results of the adhesion property and the number of dark spots of the optical elements manufactured in Examples and Comparative Examples (indicated as "Ex." and "Com. Ex." in FIG. 11).

DESCRIPTION OF THE PREFERRED EMBODIMENTS

In the following, an explanation will be made with reference to the drawings about an embodiment of a light emitting element and a method for manufacturing the light emitting element according to the present invention.

[Light Emitting Element]

Figure 1A:
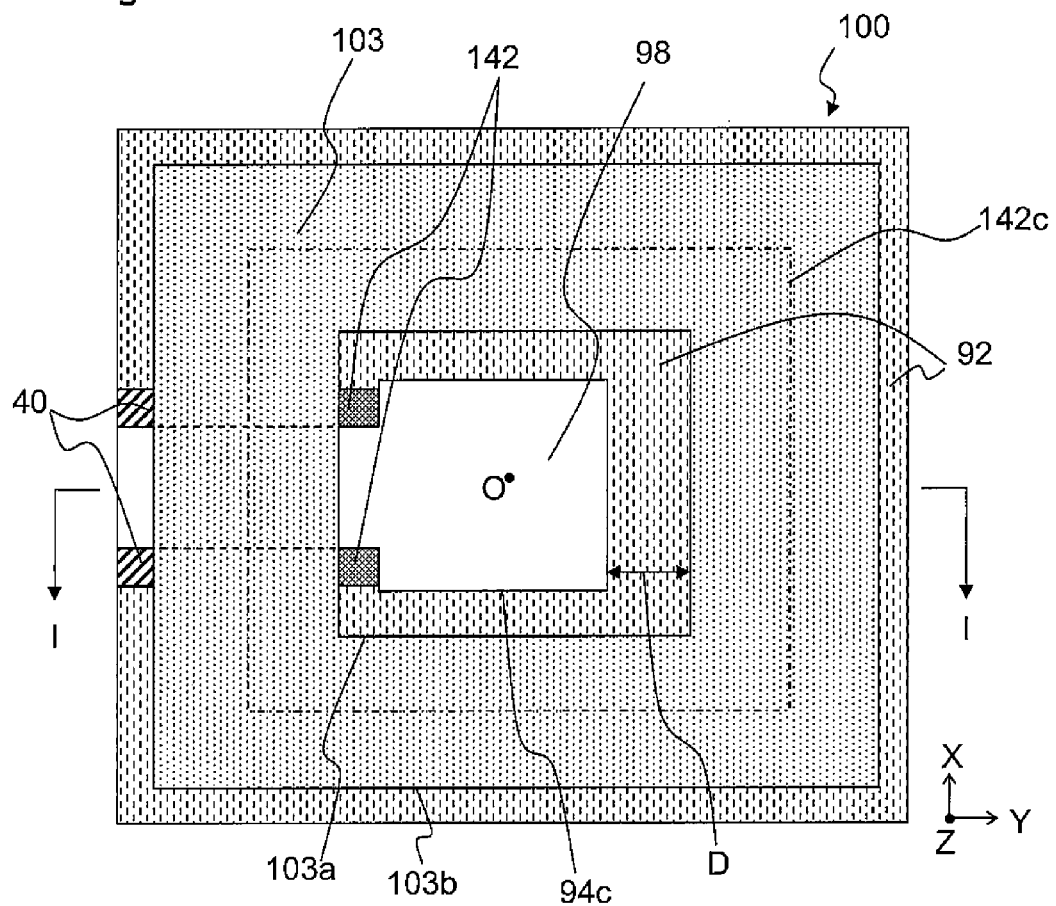
Figure 1B:
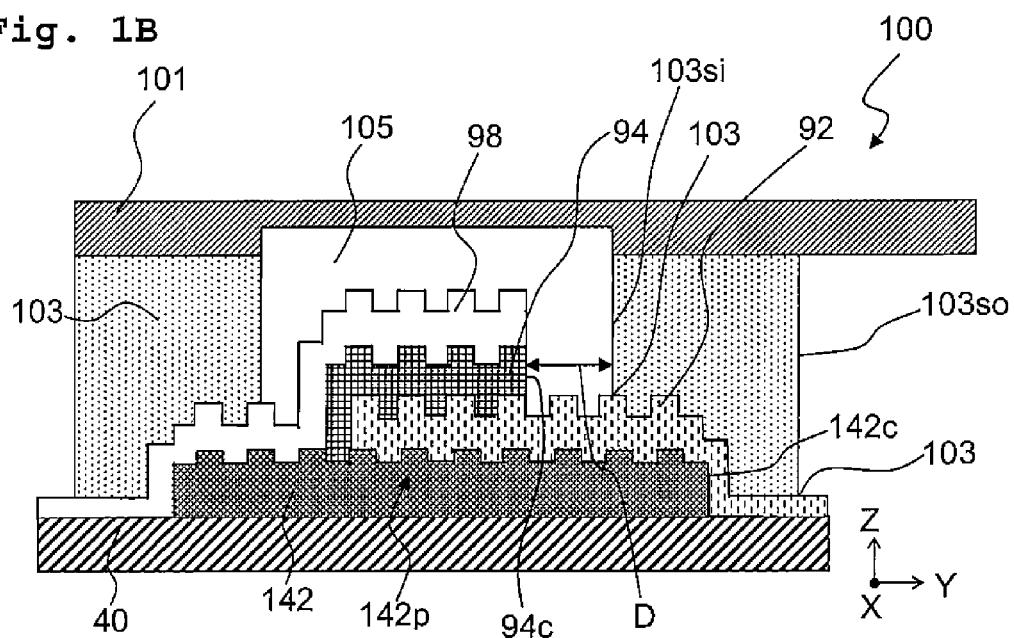

FIG. 1A is a schematic top view depicting a light emitting element 100 according to this embodiment, and FIG. 1B is a schematic cross-sectional view thereof. The light emitting element 100 includes a plate-shaped base member 40, a sealing member 101 which is disposed to face a surface of the base member 40 with a space 105 intervening therebetween, a concave-convex structure layer 142, a first electrode 92, an organic layer 94, a second electrode 98, and an adhesive layer 103. In the space 105, the concave-convex structure layer 142, the first electrode 92, the organic layer 94, and the second electrode 98 are formed on the base member 40 in that order. As depicted in FIGS. 1A and 1B, the center of the base member 40 is defined as O, and an in-plane direction is defined as an XY direction and a direction perpendicular to the XY direction, namely, a height direction of the light emitting element 100 is defined as a Z direction. In this embodiment, the adhesive layer 103 is a rectangular frame body having an opening at its center. The adhesive layer 103 is arranged in a state of being sandwiched between the base member 40 and the sealing member 101 in the height direction (Z direction). In this structure, an inner circumferential surface 103si of the adhesive layer 103 constituting the frame body defines the space 105, and an outer circumferential surface 103so of the adhesive layer 103 constituting the frame body defines a boundary, which is parallel to the height direction of the light emitting element 100, between the adhesive layer 103 and an external space.

In this embodiment, the concave-convex structure layer 142 formed on the base member 40 has a rectangular shape of which planar structure (planar shape) is smaller to some extent than that of the base member 40. An outer periphery 142c of the concave-convex structure layer 142 is positioned within the planar shape (planar area) of the base member 40. The adhesive layer 103 is the frame body as described above. A part, of the outer circumferential surface 103so, which makes contact with the base member 40 or any one of the layers formed thereon is referred to as an outer periphery 103b of the adhesive layer 103, and a part, of the inner circumferential surface 103si, which makes contact with the base member 40 or any one of the layers formed thereon is referred to as an inner periphery 103a of the adhesive layer 103 (see FIG. 1B). As will be described later, the concave-convex structure layer 142 is disposed such that the outer periphery 142c of the concave-convex structure layer 142 is positioned between the inner periphery 103a and the outer periphery 103b of the adhesive layer 103 in an XY plane. In order to show a planer positional relation between the concave-convex structure layer 142 and the adhesive layer 103, the illustration of the sealing member 101 is omitted and the outer periphery 142c of the concave-convex structure layer 142 is indicated by a dot-and-dash line in FIG. 1A. In this configuration or arrangement, the concave-convex structure layer 142 is contained in (positioned within) the space 105 which is closed by the outer circumferential surface 103so of the adhesive layer 103, the base member 40, and the sealing member 101, and thus the concave-convex structure layer 142 is not exposed to the outside of the adhesive layer 103 (atmospheric air). Therefore, moisture and oxygen are prevented from penetrating through the concave-convex structure layer 142 and entering the sealed space 105. As a result, the organic layer 94 and the like is less likely to be deteriorated and the service life of the light emitting element 100 is elongated. Further, the inner periphery 103a of the adhesive layer may adhere to the concave-convex surface of the concave-convex structure layer or the concave-convex surface of the first electrode, the organic layer or the second electrode, which reflects concavities and convexities of the concave-convex structure layer. Allowing the inner periphery 103a of the adhesive layer to adhere to the concave-convex surfaces provides tight connection between the adhesive layer 103 and the base member 40 and the tight connection is maintained for a long period of time after the sealing. Thus, no exfoliation occurs and the service life of the light emitting element improves.

<Base Member>

The base member 40 is not particularly limited, and it is possible to appropriately use any known transparent substrate which can be used for the light emitting element. Those usable as the base member 40 include, for example, a substrate made of a transparent inorganic material such as glass; substrates made of resins such as polyester (polyethylene terephthalate, polybutylene terephthalate, polyethylene naphthalate, and the like), an acrylic-based resin (polymethyl methacrylate and the like), polycarbonate, polyvinyl chloride, a styrene-based resin (ABS resin and the like), a cellulose-based resin (triacetyl cellulose and the like), a polyimide-based resin (polyimide resin, polyimideamide resin, and the like) and cycloolefin polymer; a stacked substrate obtained by forming, on the surface of a substrate made of any one of the foregoing resins, a gas barrier layer made of an inorganic material such as SiN, $SiO_2$, SiC, $SiO_xN_y$, $TiO_2$, or $Al_2O_3$ and/or a gas barrier layer made of a resin material; and a stacked substrate obtained by alternately stacking, on a substrate made of any one of the foregoing resins, the gas barrier layers made of the inorganic material or the resin material. In terms of uses of the light emitting element, the base member 40 desirably has the heat resistance and the weather resistance to UV light and the like. Thus, base members made of inorganic materials such as glass and quarts substrates are more preferably used. Especially, when the base member 40 is made of the inorganic material, the concave-convex structure layer 142 may be made of an inorganic material such as a sol-gel material. In this case, the difference between the refractive index of the base member 40 and the refractive index of the concave-convex structure layer 142 is small and unintended refraction and/or reflection in the light emitting element 100 can be prevented. Thus, the base member 40 is preferably made of any inorganic material. It is allowable to perform a surface treatment or provide an easy-adhesion layer on the base member 40 to improve an adhesion property. Further, it is allowable to form a concave-convex structure having a lens function, a light diffusion function, and the like, or to put a film or the like having the similar functions, on a surface of the base member 40 opposite to the surface on which the concave-convex structure layer 142 is formed. It is preferred that the thickness of the base member 40 be in a range of 1 to 2000 μm.

<Concave-Convex Structure Layer>

Figure 12A:
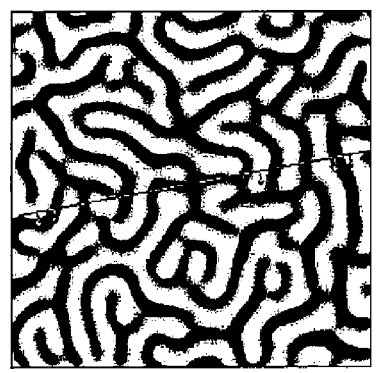
FIG. 12A is a schematic plan view of the concave-convex structure layer of the optical element according to the embodiment.
Figure 12B:
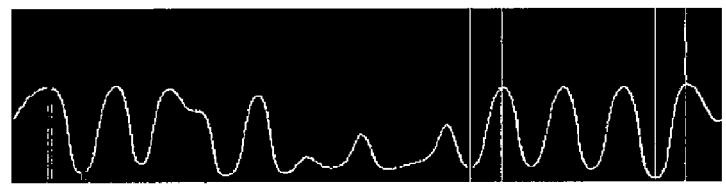
FIG. 12B is a cross-section profile taken along the cutting-plane line in FIG. 12A.

The concave-convex structure layer 142 is a layer having a minute concave-convex pattern 142p formed on the surface thereof. The minute concave-convex pattern 142p may be any pattern such as a microlens array structure or a structure having the light diffusion function, light diffraction function, etc. FIG. 12A is an exemplary schematic plan view of the concave-convex pattern 142p of the concave-convex structure layer 142 according to this embodiment, and FIG. 12B is a cross-section profile taken along the cutting-plane line in FIG. 12A. As depicted in FIG. 12B, the cross-sectional shape of the concave-convex structure layer 142 may be formed of relatively gentle inclined surfaces, that is, the cross-sectional shape of the concave-convex structure layer 142 may be a wave shape (referred to as "wave-like structure" as appropriate in the present application) in a direction upward from the base member 40. Namely, each convex portion of the concave-convex pattern 142p may have a cross-sectional shape which narrows from the bottom on the base member 40 side toward the top. The concave-convex pattern 142p of the concave-convex structure layer 142 may be characterized in that the concave portions and convex portions have an elongated shape, as viewed in a plan view (FIG. 12A is an exemplary schematic plan view), in which convex portions (white portions) and concave portions (black portions) extend meanderingly or tortuously and have irregular extending directions, irregular waviness directions (bending directions), and irregular lengths in the extending directions thereof. Such a concave-convex pattern is clearly different from patterns with regular orientations such as stripes, wave-like stripes, and zigzags; dot-like patterns; and the like. Thus, the concave-convex pattern 142p is distinguishable from those such as a circuit pattern which has regularity and many straight lines. The characteristics of the concave-convex structure layer 142 allow its concave-convex cross-section to repeatedly appear when the concave-convex structure layer 142 is cut in any directions perpendicular to the surface of the base member 40. Further, some or all of concave portions and convex portions of the concave-convex pattern may branch at their intermediate parts as viewed in a plan view (see FIG. 12A). In FIG. 12A, the pitch of convex portions appears to be uniform as a whole. Each concave portion of the concave-convex pattern may be defined by each convex portion of the concave-convex pattern such that the concave portion extends along the convex portion.

In addition to the irregular concave-convex pattern as described above, the concave-convex structure layer 142 may be any pattern such as a dot structure; a prism structure; a stripe structure formed of lines and spaces; a pillar structure such as a cylindrical shape, a conical shape, a truncated cone shape, a triangle pole shape, a triangular pyramid shape, a truncated triangular pyramid shape, a square pole shape, a quadrangular pyramid shape, a truncated quadrangular pyramid shape, a polygonal column shape, a polygonal pyramid shape, or a truncated polygonal pyramid shape; or a hole structure. Alternatively, the concave-convex structure layer 142 may be an irregular minute concave-convex pattern formed by a sandblasting method.

In order that the concave-convex structure layer 142 functions as the diffraction grating, the average pitch of concavities and convexities is preferably in a range of 100 to 1500 nm. When the average pitch of concavities and convexities is less than the lower limit, pitches are so small relative to wavelengths of the visible light that the diffraction of the light by concavities and convexities is less likely to occur. When the average pitch exceeds the upper limit, the diffraction angle is so small that functions as the diffraction grating are more likely to be lost. The average pitch of concavities and convexities is more preferably in a range of 200 to 1,200 nm. The average value of the depth distribution of concavities and convexities is preferably in a range of 20 to 200 nm. When the average value of the depth distribution of concavities and convexities is less than the lower limit, the depth is so small relative to the wavelengths of the visible light that the required diffraction is less likely to occur. On the other hand, when the average value exceeds the upper limit, the intensity of diffracted light becomes non-uniform, which in turn results in the following tendency. Namely, the electric field distribution in the organic layer 94 of the light emitting element 100 becomes non-uniform, thereby causing the electric field to concentrate on a certain position or area in the organic layer 94 and thus causing any leak current to be easily generated, and/or shortening the service life of the light emitting element 100. The average value of the depth distribution of concavities and convexities is more preferably in a range of 30 to 150 nm. The standard deviation of the depth of convexities and concavities is preferably in a range of 10 to 100 nm. When the standard deviation of depth of convexities and concavities is less than the lower limit, the depth is so small relative to the wavelengths of the visible light that the required diffraction is less likely to occur. On the other hand, when the standard deviation exceeds the upper limit, the intensity of diffracted light becomes non-uniform, which in turn results in the following tendency. Namely, the electric field distribution in the organic layer 94 of the light emitting element 100 becomes non-uniform, thereby causing the electric field to concentrate on a certain position or area in the organic layer 94 and thus causing any leak current to be easily generated, and/or shortening the service life of the light emitting element 100.

Note that the term "average pitch of concavities and convexities" means an average value of the pitch of concavities and convexities in a case of measuring the pitch of concavities and convexities (spacing distance between adjacent convex portions or spacing distance between adjacent concave portions) in a surface on which the convexities and concavities are formed. Such an average value of the pitch of concavities and convexities is obtained as follows. Namely, a concavity and convexity analysis image is obtained by measuring the shape of concavities and convexities on the surface by using a scanning probe microscope (for example, a scanning probe microscope manufactured by Hitachi High-Tech Science Corporation, under the product name of "E-sweep", etc.), under the following measurement conditions, then the distances between randomly selected concave portions or convex portions adjacent to each other are measured at not less than 100 points in the concavity and convexity analysis image, and then the average of the distances is calculated and is determined as the average value of the pitch of concavities and convexities.

The measurement conditions are as follows:
Measurement mode: cantilever intermittent contact mode
Material of the cantilever: silicon
Lever width of the cantilever: 40 μm
Diameter of tip of chip of the cantilever: 10 nm Further, in the present application, the average value of the depth distribution of concavities and convexities and the standard deviation of the depth of concavities and convexities can be calculated by the following manner. Namely, a concavity and convexity analysis image is obtained by measuring the shape of concavities and convexities on the surface by using a scanning probe microscope (for example, a scanning probe microscope manufactured by Hitachi High-Tech Science Corporation, under the product name of "E-sweep", etc.), in a randomly selected measurement region of 3 μm square (vertical: 3 μm, horizontal: 3 μm) or in a randomly selected measurement region of 10 μm square (vertical: 10 μm, horizontal: 10 μm) under the above-described conditions. When doing so, data of height of concavities and convexities at not less than 16,384 points (vertical: 128 points×horizontal: 128 points) are obtained within the measurement region, each in nanometer scale. Note that although the number of measurement points is different depending on the kind and setting of the measuring device which is used, for example in a case of using the above-described scanning probe microscope manufactured by Hitachi High-Tech Science Corporation, under the product name of "E-sweep", it is possible to perform the measurement at measurement points of 65,536 points (vertical: 256 points×horizontal: 256 points; namely, the measurement in a resolution of 256×256 pixels) within the measurement region of 3 μm square. With respect to the height of concavities and convexities (unit: nm) measured in such a manner, at first, a measurement point "P" is determined, among all the measurement points, which is the highest from the surface of a substrate. Then, a plane which includes the measurement point P and which is parallel to the surface of the substrate is determined as a reference plane (horizontal plane), and a depth value from the reference plane (difference obtained by subtracting, from the value of height from the substrate at the measurement point P, the height from the substrate at each of the measurement points) is obtained as the data of depth of concavities and convexities. Note that such a depth data of concavities and convexities can be obtained, for example, by performing automatic calculation with software in the measurement device (for example, the above-described scanning probe microscope manufactured by Hitachi High-Tech Science Corporation, under the product name of "E-sweep"), and the value obtained by the automatic calculation in such a manner can be utilized as the data of depth of concavities and convexities. After obtaining the data of depth of concavity and convexity at each of the measurement points in this manner, the values, which can be calculated by obtaining the arithmetic average value and the standard deviation of the obtained data of depth of concavity and convexity, are adopted as the average value of the depth distribution of concavities and convexities and the standard deviation of the depth of concavities and convexities. In this specification, the average pitch of concavities and convexities and the average value of the depth distribution of concavities and convexities can be obtained via the above-described measuring method, regardless of the material of the surface on which concavities and convexities are formed.

Note that, the term "irregular concave-convex pattern" includes such a quasi-periodic structure in which a Fourier-transformed image, obtained by performing a two-dimensional fast Fourier-transform processing on a concavity and convexity analysis image obtained by analyzing a concave-convex shape on the surface, shows a circular or annular pattern, namely, such a quasi-periodic pattern in which, although concavities and convexities have no particular orientation (directionality), the structure has the distribution of pitches of concavities and convexities (pitches of concavities and convexities vary). Therefore, the substrate having such a quasi-periodic structure is suitable for a diffraction substrate used in a surface-emitting element, such as the organic EL element, provided that the substrate has concavities and convexities of which pitch distribution or pitch variability enables the substrate to diffract visible light.

As the material of the concave-convex structure layer 142, inorganic materials may be used. In particular, it is allowable to use sol-gel materials such as silica, titanium-based materials ($TiO_2$ and the like), materials based on indium-tin oxide (ITO), and ZnO, $ZrO_2$, $Al_2O_3$, ZnS, $BaTiO_3$, and $SrTiO_2$, Of the above materials, silica or $TiO_2$ is preferably used in view of the film formation performance (coating property) and the refractive index. Further, cured resin compositions may be used as the material of the concave-convex structure layer 142. Examples of the resin compositions include photocurable resins and thermosetting resins having a reactive vinyl group such as acrylic acid-based oligomer and methacrylic acid-based oligomer; moisture curing type resins such as 2-cyanoacylic acid ester; thermosetting and chemical curing type resins (two-liquid mixing type resins) such as epoxy-based resin; hot-melt resins such as polyamide, polyester, and polyolefin; and ultraviolet curable epoxy resins of cation curable type. Examples of the resin compositions may further include various resins such as monomers, oligomers, polymers, etc., of those based on vinyl ether, oxetane, urethane, melamine, urea, phenol, cross-linking type liquid crystal, fluorine, silicone, etc. Further, as the material of the concave-convex structure layer 142, it is possible to use $SiO_x$, $SiN_x$, $SiO_xN_y$, and the like which are formed by using a polysilazane solution as raw material.

The concave-convex structure layer 142 may be one which is obtained by mixing an inorganic material or a curable resin material with an ultraviolet absorbent material. The ultraviolet absorbent material has the function or effect to prevent deterioration of the film by absorbing ultraviolet rays and converting light energy into something harmless such as heat. Any known agent may be used as the ultraviolet absorbent material. Those usable as the ultraviolet absorbent material include, for example, benzotriazole-based absorbents, triazine-based absorbents, salicylic acid derivative-based absorbents, and benzophenone-based absorbents.

The thickness of the concave-convex structure layer 142 is preferably in a range of 100 nm to 10 μm. When the thickness of the concave-convex structure layer 142 is less than 100 nm, the transfer of the concave-convex shape by imprinting as described later is difficult. When the thickness of the concave-convex structure layer exceeds 10 μm, any structural defect such as a crack is more likely to occur. The thickness of the concave-convex structure layer 142 in this context means an average value of distances from the bottom surface of the concave-convex structure layer 142 to the surface in which the concave-convex pattern 142*p* is formed.

Figure 2:
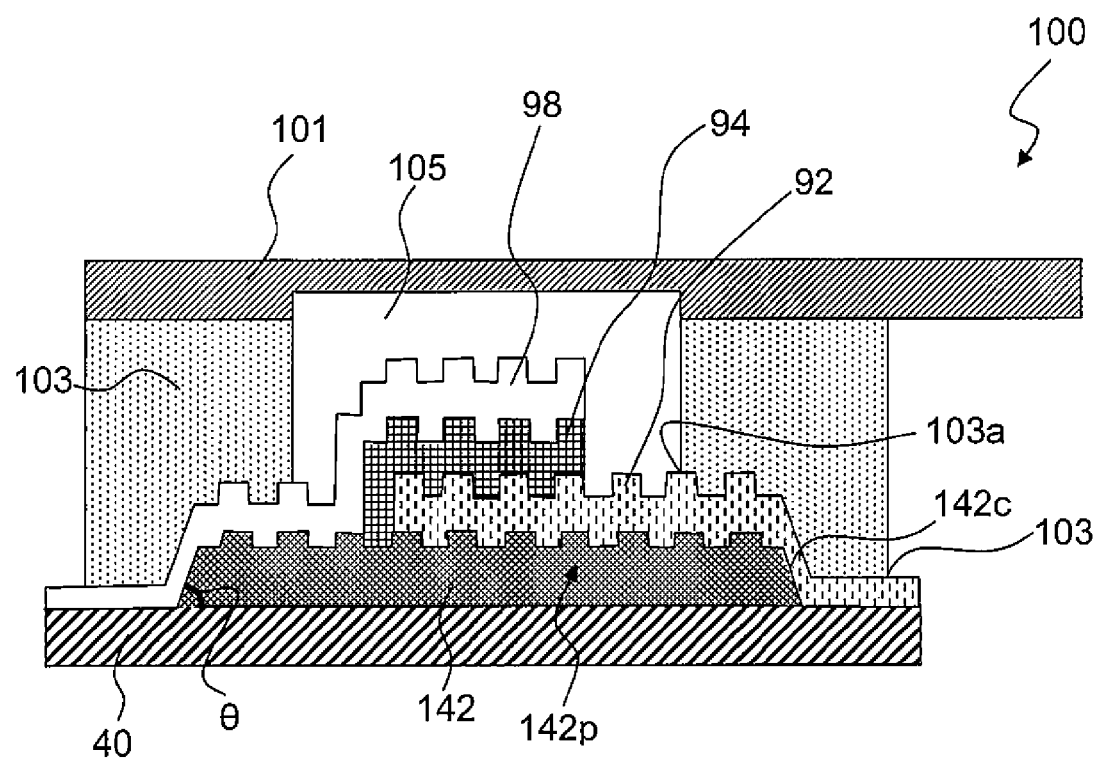
FIG. 2 is a schematic cross-sectional view of a specific form or shape of the light emitting element according to the embodiment.

As depicted in FIG. 2, when θ denotes an angle (hereinafter to be referred to as "taper angle of the concave-convex structure layer" as appropriate), which is formed by the outer periphery (side surface) 142*c* of the concave-convex structure layer 142 and the surface of the base member 40, it is preferred that the outer periphery (side surface) 142*c* of the concave-convex structure layer be an inclined surface satisfying θ≤80°. When the taper angle θ of the concave-convex structure layer is nearly vertical (θ>80°), the following situation may occur. Namely, when a film of the first electrode 92 or the second electrode 98 is formed by a sputtering method or vapor deposition method, the deposited material has difficulty in reaching to the outer periphery (side surface) 142*c* of the concave-convex structure layer and the surface of the base member in the vicinity of the outer periphery 142*c*. This causes the film formed in these areas to have a small thickness. The unevenness of the film thickness may result in any failure such as breaking or disconnecting of electrodes. On the other hand, when the outer periphery (side surface) 142*c* of the concave-convex structure layer 142 is inclined such that the taper angle θ of the concave-convex structure layer satisfies θ ≤80°, the deposited material can satisfactorily reach to the outer periphery (side surface) 142*c* of the concave-convex structure layer and the surface of the base member in the vicinity of the outer periphery 142*c*. This prevents the first electrode 92 and the second electrode 98, which have been formed on the outer periphery (side surface) 142*c* of the concave-convex structure layer and the vicinity thereof, from having small thicknesses. Namely, the first electrode 92 and the second electrode 98 can be formed to have uniform film thicknesses respectively, unlike the case in which the taper angle θ of the concave-convex structure layer is nearly vertical (θ>80°).

When the adhesive force between the base member 40 and the concave-convex structure layer 142 is weak, an adhesion layer may be provided between the base member 40 and the concave-convex structure layer 142. The adhesion layer may be made of a silane coupling agent or the like. Those usable as the silane coupling agent include, for example, agents having an acrylic group and agents having a methacryl group such as KBM-5103 (produced by SHIN-ETSU CHEMICAL, CO., LTD.) and KBM-503 (produced by SHIN-ETSU CHEMICAL, CO., LTD.).

The coating layer may be formed on the surface of the concave-convex structure layer 142. It is preferred that the thickness of the coating layer be in a range of 25% to 150% of the standard deviation of depth of concavities and convexities of the concave-convex structure layer 142. Such a coating layer can cover any foreign matter and defect which might be present on the surface of the concave-convex structure layer. Thus, leak current in the light emitting element can be effectively prevented. The light emitting element, in which the coating layer having a thickness within the above range has been formed on the concave-convex structure layer, has good light extraction efficiency.

Those usable as the material of the coating layer (coating material) include for example, sol-gel materials such as $SiO_x$, $TiO_x$, ZnO, $ZrO_2$, $Al_2O_3$, ZnS, $BaTiO_3$, $SrTiO_2$, and indium-tin oxide (ITO); cured products of resin compositions; $SiO_x$, $SiN_x$, $SiO_xN_y$ and the like formed by using the polysilazane solution as the raw material, those of which have been cited as usable materials of the concave-convex structure layer 142; and those obtained by mixing each of the above materials with any known particles, filler, ultraviolet absorbent material, etc. It is especially preferred that the material of the coating layer be identical to the material of the concave-convex structure layer. When the coating material is identical to the material of the concave-convex structure layer, reflection of light at an interface between the coating layer and the concave-convex structure layer can be prevented. As a sol-gel material solution used in formation of the coating layer, it is preferred that a diluted solution, which is diluted with a solvent to be weaker than the sol-gel material solution used in formation of the concave-convex structure layer, be used. In such a case, the coating layer can be easily formed to have a predetermined film thickness which is thinner than the concave-convex structure layer.

The silane coupling agent may be used as the coating material. The use of the silane coupling agent can improve the adhesion property between the coating layer and a layer, such as an electrode, to be formed on the coating layer. This develops the resistance in the cleaning step and the high temperature treatment step included in the production process of an optical element. The type or kind of silane coupling agent used for the coating layer is not particularly limited, and those usable as the silane coupling agent include, for example, an organic compound represented by $RSiX_3$ (R is an organic functional group containing at least one selected from a vinyl group, a glycidoxy group, an acryl group, a methacryl group, an amino group, and a mercapto group, and X is a halogen element or an alkoxyl group).

It is allowable to provide a gas barrier layer on the surface of the concave-convex structure layer 142 or the surface of the coating layer in order to keep out moisture and gas such as oxygen.

<First Electrode>

The first electrode 92 may be a transparent electrode so that the light from the organic layer 94 formed on the first electrode 92 passes toward the base member 40. It is preferred that the first electrode 92 be stacked such that the surface of the first electrode 92 maintains or shows the concave-convex structure formed in the surface of the concave-convex structure layer 142. Although FIG. 1A depicts the configuration in which the first electrode 92 is formed to cover the concave-convex structure layer 142 except for an area in (on) which a lead-out wiring of the second electrode 98 as described later is to be formed and the vicinity thereof, it is not necessarily required to cover the concave-convex structure layer 142. The arrangement and the shape of the first electrode 92 are not particularly limited.

Those usable as the material of the first electrode 92 include, for example, indium oxide, zinc oxide, tin oxide, indium-tin oxide (ITO) which is a composite material thereof, gold, platinum, silver, and copper. Of these materials, ITO is preferable from the viewpoint of transparency and electrical conductivity. The thickness of the first electrode 92 is preferably within a range of 20 to 500 nm. When the thickness is less than the lower limit, the electrical conductivity is more likely to be insufficient. When the thickness exceeds the upper limit, there is possibility that the transparency is so insufficient that the emitted EL light cannot be extracted to the outside sufficiently. Further, there is fear that the surface of the first electrode 92 can not maintain or show the concave-convex structure formed in the surface of the concave-convex structure layer 142 depending on the depth of concavities and convexities of the concave-convex structure layer 142.

<Organic Layer>

As depicted in FIGS. 1A and 1B, the organic layer 94 is formed on the first electrode 92 to have a range or area smaller than the concave-convex structure layer 142. Namely, an outer periphery 94c of the organic layer 94 is positioned inside the outer periphery 142c of the concave-convex structure layer 142 and thus the organic layer 94 can be sealed by the adhesive layer 103 and the sealing member 101. The organic layer 94 is not particularly limited, provided that it is usable as an organic layer of the organic EL element. As the organic layer 94, any known organic layer can be used as appropriate. The surface of the organic layer 94 may maintain the shape of the concave-convex structure layer 142 or may be flat without maintaining the shape of the concave-convex structure layer 142. The organic layer 94 may be a stacked body of various organic thin films. For example, the organic layer 94 may be a stacked body of a hole transporting layer, a light-emitting layer, and an electron transporting layer. Those usable as the material of the hole transporting layer include, for example, aromatic diamine compounds such as phthalocyanine derivatives, naphthalocyanine derivatives, porphyrin derivatives, N,N'-bis(3-methylphenyl)-(1,1'-biphenyl)-4,4'-diamine (TPD), and 4,4'-bis[N-(naphthyl)-N-phenyl-amino]biphenyl(α-NPD); oxazole; oxadiazole; triazole; imidazole; imidazolone; stilbene derivatives; pyrazoline derivatives; tetrahydroimidazole; polyarylalkane; butadiene; and 4,4',4''-tris(N-(3-methylphenyl)N-phenylamino)triphenylamine (m-MTDATA). The examples of materials of the hole transporting layer, however, are not limited to the above. By providing the light emitting layer, a hole injected from the first electrode 92 and electron injected from the second electrode 98 are recombined to occur light emission. Those usable as the material of the light emitting layer include, for example, metallo-organic complex such as anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, and aluminum-quinolinol complex (Alq3); tri-(p-terphenyl-4-yl)amine; 1-aryl-2,5-di(2-thienyl) pyrrole derivatives; pyran; quinacridone; rubren; distyrylbenzene derivatives; distyryl arylene derivatives; distyryl amine derivatives; and various fluorescent pigments or dyes. Further, it is preferred that light-emitting materials selected from the above compounds be mixed as appropriate and then used. Furthermore, it is possible to preferably use a material system generating emission of light from a spin multiplet, such as a phosphorescence emitting material generating emission of phosphorescence and a compound including, in a part of the molecules, a constituent portion formed by the above materials. The phosphorescence emitting material preferably includes heavy metal such as iridium. A host material having high carrier mobility may be doped with each of the light-emitting materials as a guest material to generate the light emission using dipole-dipole interaction (Forster mechanism) or electron exchange interaction (Dexter mechanism). Those usable as the material of the electron transporting layer include, for example, heterocyclic tetracarboxylic anhydrides such as nitro-substituted fluorene derivatives, diphenylquinone derivatives, thiopyran dioxide derivatives, and naphthaleneperylene; and metalloorganic complex such as carbodiimide, fluorenylidene methane derivatives, anthraquino dimethane and anthrone derivatives, oxadiazole derivatives, and aluminum-quinolinol complex (Alq3). Further, in the oxadiazole derivatives mentioned above, it is also possible to use, as an electron transporting material, thiadiazole derivatives in which oxygen atoms of oxadiazole rings are substituted by sulfur atoms and quinoxaline derivatives having quinoxaline rings known as electron attractive group. Furthermore, it is also possible to use a polymeric material in which the above materials are introduced into a macromolecular chain or the above materials are made to be a main chain of the macromolecular chain. It is noted that the hole transporting layer or the electron transporting layer may also function as the light-emitting layer.

From the viewpoint of facilitating the electron injection from the second electrode 98, a layer made of a metal fluoride or metal oxide such as lithium fluoride (LiF) or $Li_2O_3$, a highly active alkaline earth metal such as Ca, Ba, or Cs, an organic insulating material, or the like may be provided as an electron injection layer between the organic layer 94 and the second electrode 98. Further, from the viewpoint of facilitating the hole injection from the first electrode 92, it is allowable to provide, as a hole injection layer between the organic layer 94 and the first electrode 92, a layer made of triazol derivatives, oxadiazole derivative, imidazole derivative, polyarylalkane derivatives, pyrazoline and pyrazolone derivatives, phenylenediamine derivative, arylamine derivatives, amino-substituted calcone derivatives, oxazole derivatives, styrylanthracene derivatives, fluorenone derivatives, hydrazone derivatives, stilbene derivatives, silazane derivatives, aniline-based copolymers, or electroconductive high-molecular oligomar, particularly thiophene oligomer.

Furthermore, when the organic layer 94 is a stacked body formed of the hole transporting layer, the light emitting layer, and the electron transporting layer, the thicknesses of the hole transporting layer, the light emitting layer, and the electron transporting layer are preferably within a range of 1 to 200 nm, a range of 5 to 100 nm, and a range of 5 to 200 nm, respectively.

<Second Electrode>

Materials of the second electrode 98 are not particularly limited, and a substance having a small work function can be used as appropriate. For example, the second electrode 98 may be a metal electrode using aluminum, MgAg, MgIn, AlLi, or the like. The thickness of the second electrode 98 is preferably in a range of 50 to 500 nm. When the thickness is less than the lower limit, the electrical conductivity is more likely to be decreased. When the thickness exceeds the upper limit, there is such a possibility that the repair might be difficult to perform when any short circuit occurs between the electrodes. The second electrode 98 may be stacked such that the surface of the second electrode 98 maintains or shows the concave-convex structure formed in the surface of the concave-convex structure layer 142.

<Adhesive Layer>

The adhesive layer 103 is formed between the base member 40 and the sealing member 101 as described later to overlap the outer periphery (side surface) 142c of the concave-convex structure layer 142. In this configuration or arrangement, the outer periphery (side surface) 142c of the concave-convex structure layer 142 is positioned between the inner periphery 103a and the outer periphery 103b of the adhesive layer 103. Note that the phase "the outer periphery (side surface) 142c of the concave-convex structure layer 142 is positioned between the inner periphery 103a and the outer periphery 103b of the adhesive layer 103" means as follows. Namely, a part of the outer periphery (side surface) 142c of the concave-convex structure layer 142 may be inside the inner periphery 103a of the adhesive layer 103 (on the side, of the inner periphery 103a, close to the center of the base member) and it is not necessary that the whole circumferential part of the outer periphery (side surface) 142c of the concave-convex structure layer 142 is positioned between the inner periphery 103a and the outer periphery 103b of the adhesive layer 103. In other words, the above phase includes a case in which a part of the outer periphery (side surface) 142c of the concave-convex structure layer 142 is positioned in the sealed space 105. In this arrangement, the concave-convex structure layer 142 is not exposed to the outside of the adhesive layer 103 (atmospheric air), and thus moisture and oxygen are prevented from penetrating through the concave-convex structure layer 142 and entering the sealed space 105. Therefore, the organic layer 94 and the like is less likely to be deteriorated and the service life of the light emitting element is elongated. Further, in this arrangement, the inner periphery 103a of the adhesive layer 103 adheres to the concave-convex surface of the concave-convex structure layer 142 or the concave-convex surface of the first electrode 92, the organic layer 94 or the second electrode 98 reflecting or showing concavities and convexities of the concave-convex structure layer 142. In addition to the above, when the outer periphery (side surface) 142c of the concave-convex structure layer 142 is inclined as depicted in FIG. 2, the inner periphery 103a of the adhesive layer 103 adheres to the concave-convex surface of the concave-convex structure layer 142 or the concave-convex surface of the first electrode 92, the organic layer 94 or the second electrode 98 reflecting or showing concavities and convexities of the concave-convex structure layer 142. Allowing the adhesive layer 103 to adhere to the concave-convex surfaces provides not only chemical adhesion brought about by the adhesive but also "catching" and the like brought about by concavities and convexities to make mechanical releasing (mechanical exfoliation) more difficult. Further, allowing the adhesive layer 103 to adhere to the concave-convex surfaces provides an increased interface area. Such effects strengthen the adhesion (connection) between the base member 40 and the adhesive layer 103. As a result, the organic layer 94 is sealed more reliably. Further, the high adhesive force is maintained for a long period of time after the sealing and no exfoliation occurs. Such high adhesive force allows the adhesive layer 103 to have a narrower line width, thereby making it possible to increase an area of the organic layer (light emitting part). In order to effectively extract the light emitted from the organic layer 94, it is preferred that the adhesive layer 103 be formed with a predetermined distance D from the organic layer 94, i.e., in a state that the adhesive layer 103 is not brought into contact with the organic layer 94. It is preferred that the distance D be, for example, not less than 1 µm. For the purpose of achieving both good adhesion strength and good sealing performance, it is preferred that the outer periphery (side surface) 142c of the concave-convex structure layer 142 be positioned roughly halfway between the inner periphery 103a and the outer periphery 103b of the adhesive layer 103.

As the material of the adhesive layer 103, adhesives widely used for glass, a plastic substrate, and the like can be used without limitation. Those usable as the material of the adhesive layer 103 include, for example, polyvinyl acetate-based adhesives; photocurable and thermosetting acrylic adhesives having a reactive vinyl group such as acrylic acid-based oligomer and methacrylic acid-based oligomer; epoxy resin adhesives; moisture curing type adhesives such as 2-cyanoacylic acid ester; ethylene copolymer-based adhesives; polyester-based adhesives; polyimide-based adhesives; amino resin-based adhesives made of a urea resin, a melamine resin, and the like; phenol resin-based adhesives; polyurethane-based adhesives; reactive (meth)acrylic adhesives; and rubber-based adhesives. Of the above adhesives, the acrylic adhesives, the epoxy-based adhesives, etc. are especially preferable. The epoxy-based adhesives, which contract or shrink to a lesser extent at the time of curing, are particularly preferable.

The epoxy-based adhesives include, for example, an epoxy resin composition made of an epoxy resin and a curing agent. The adhesive force of the epoxy resin composition is generated by its curing reaction, which is brought about by mixing a compound containing an epoxy group with the curing agent containing amines and acid anhydride.

The epoxy-based adhesives usable in the present invention are exemplified, for example, by Cemedine EP-001 produced by CEMEDINE Co., ltd.; 3950, 3951 and 3952 of 3950 series, 2083, 2086 and 2087 of 2080 series, and 2230 and 2230B of 2230 series, and 3124C produced by ThreeBond Holdings Co., Ltd.; MOS07 and MOS10 of Bond MOS series produced by Konishi Co., Ltd.; ULTIGHT 1540 and the like of ULTIGHT 1500 series produced by TOHO KASEI CO., LTD.; and XNR5576/5576LV, XNR5516/5516HV/5516Z, XNR5570, T470/UR7116, T470/UR7134, T470/UR7132, T470/UR7124E-LV, and the like produced by Nagase ChemteX Corporation.

The acrylic-based adhesives include, for example, an adhesive containing an acrylic-based adhesive component, an energy-ray curable component and a thermosetting adhesive component. The acrylic-based adhesives usable in the present invention are exemplified, for example, by 3003, 3027B, 3033B, 3042B, and the like produced by ThreeBond Holdings Co., Ltd.; and Cemedine Y600, Cemedine Y600H, and the like produced by CEMEDINE CO., ltd.

The rubber-based adhesives include, for example, one obtained in such a manner that adhesive elastomer, an adhesion-imparting agent, a softening agent, and the like are mixed with one another. The adhesive elastomer is at least one kind of adhesive elastomer selected, for example, from natural rubber composed mainly of cis-1,4-polyisoprene; synthetic rubber composed mainly of styrene-butadiene rubber (SBR), polyisobutylene, butyl rubber, and the like; and block rubber composed mainly of styrene-butadiene-styrene copolymer rubber (SBS), styrene-isoprene-styrene copolymer rubber (SIS), and the like. The adhesion-imparting agent is a thermoplastic resin containing an amorphous oligomer (middle-molecular weight polymer of a dimer or more), the amorphous oligomer being a liquid or solid at normal temperature and having a molecular weight in a range of hundreds to about ten thousand, such as a rosin-based resin, a terpene-based resin, a petroleum resin, and a chroman-indene resin. The softening agent is exemplified, for example, by mineral oil, liquid polybutene, liquid polyisobutylene, and liquid polyacrylic ester.

Examples of vinyl ether adhesives include an adhesive composed of a homopolymer such as vinyl methyl ether, vinyl ethyl ether or vinyl isobutyl ether, an adhesive composed of a copolymer of acrylate and vinyl ether such as vinyl methyl ether, vinyl ethyl ether or vinyl isobutyl ether (adhesive elastomer), and the like. Each of the above-described vinyl ether adhesives may be mixed with the above-described adhesion-imparting agent, softening agent, or the like.

Examples of silicone-based adhesives include one obtained in such a manner that a polymer (or adhesive elastomer) containing a residual silanol group (SiOH) at an end of a polymer chain is mixed with the above-described adhesion-imparting agent, softening agent, or the like. The polymer containing a residual silanol group is represented by polydimethylsiloxane or polydimethyldiphenylsiloxane having high molecular weight.

<Sealing Member>

The sealing member 101 is disposed to face the base member 40 with the space (sealed space) 105 intervening therebetween. The space 105 is sealed with the base member 40, the sealing member 101, and the adhesive layer 103. The concave-convex structure layer 142, the first electrode 92, the organic layer 94, and the second electrode 98 are positioned within the sealed space 105.

The sealing member 101 may be any member provided that it is made of a material having a high gas barrier property. Examples of the sealing member 101 include any known gas barrier films used for packaging materials and the like, such as a plastic film in which silicon oxide or aluminum oxide is deposited; a laminate (stacked object) formed of a ceramic layer and an impact-attenuating polymer layer; metal foil laminated with a polymer film; a sealing can made of glass; a sealing can made of metal; and an engraved glass.

The sealed space 105 is filled with an inactive or inert gas or the like. $N_2$ can be used as the inactive gas, and instead of $N_2$, a noble gas such as He or Ar is preferably used. Further, a noble gas obtained by mixing He with Ar is also preferable. The ratio of the inactive gas in gases is preferably in a range of 90 to 100% by volume. Or, the sealed space 105 may be filled with infilling such as a solid or liquid resin, glass, an inactive oil such as a fluorine-based inactive oil, or a gel material. It is preferred that the infilling be transparent or cloudy. Further, a water-absorbing substance may be disposed in the sealed space 105. The water-absorbing substance is exemplified, for example, by barium oxide. Specifically, for example, high-purity barium oxide powder produced by Sigma-Aldrich Co. LLC. can be disposed in the sealed space 105 by being put or stuck on the sealing member 101 by using a fluororesin-based semi-transparent film with adhesive (MICROTEX S-NTF8031Q produced by NITTO DENKO CORPORATION) or the like. Alternatively, any commercially available water-absorbing substances produced, for example, by W. L. Gore & Associates and Futaba Corporation are preferably used.

[First Modified Embodiment of Light Emitting Element]

Figure 13:
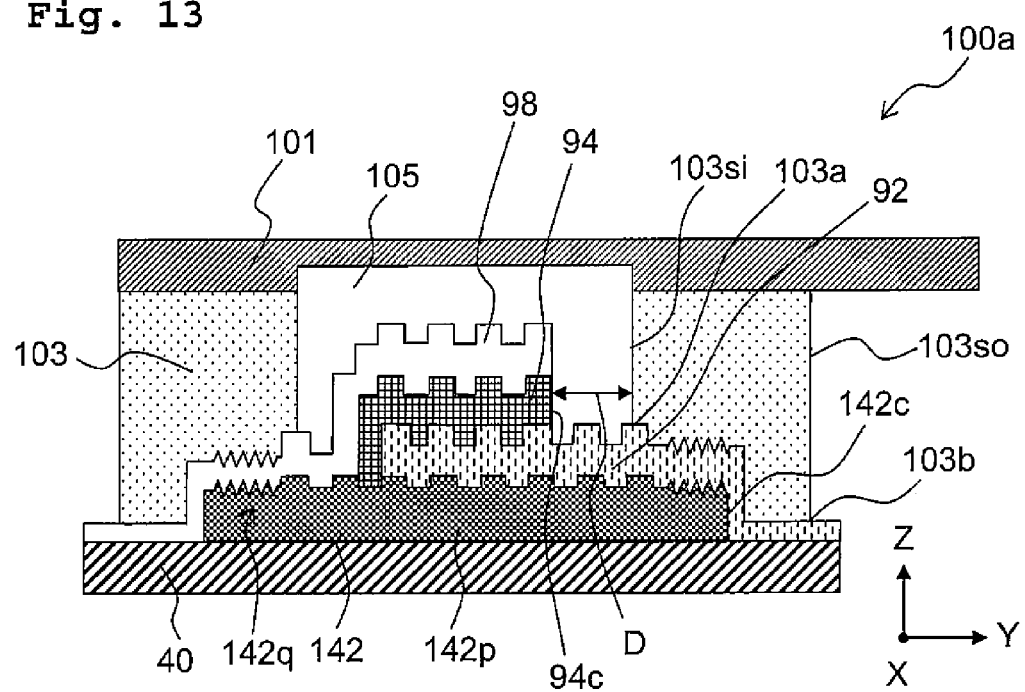
FIG. 13 is a schematic cross-sectional view of a light emitting element of the first modified embodiment.

An explanation will be made about a modified embodiment of the light emitting element 100. As depicted in FIG. 13, in the case of a light emitting element 100a of the modified embodiment, the concave-convex structure layer 142 includes not only the concave-convex pattern (first concave-convex pattern) 142p functioning as the diffracting grating but also a concave-convex pattern (second concave-convex pattern) 142q different from the concave-convex pattern 142p. In the light emitting element 100a, the first electrode 92, the organic layer 94, and the second electrode 98 are formed in that order on the first concave-convex pattern 142p functioning as the diffraction grating, and the adhesive layer 103 or the lead-out part of the electrode is formed on the second concave-convex pattern 142q. Like the light emitting element 100, the outer periphery (side surface) 142c of the concave-convex structure layer 142 of the light emitting element 100a may be formed as an inclined surface.

In addition to the irregular concave-convex pattern as described above, the second concave-convex pattern 142q may be any pattern such as a dot structure; a prism structure; a stripe structure formed of lines and spaces; a pillar structure such as a cylindrical shape, a conical shape, a truncated cone shape, a triangle pole shape, a triangular pyramid shape, a truncated triangular pyramid shape, a square pole shape, a quadrangular pyramid shape, a truncated quadrangular pyramid shape, a polygonal column shape, a polygonal pyramid shape, or a truncated polygonal pyramid shape; or a hole structure. Alternatively, the second concave-convex pattern 142q may be an irregular minute concave-convex pattern formed by a sandblasting method. Note that, in the present application, when the second concave-convex pattern 142q and the first concave-convex pattern 142p have the same shape (for example, both of the patterns 142q and 142p are formed to be the above irregular pattern), the second concave-convex pattern 142q and the first concave-convex pattern 142p may have mutually different pitches and/or heights (depths) of concavities and convexities. Such a case is also regarded as the case "the second concave-convex pattern is different from the first concave-convex pattern". The main purpose of the second concave-convex pattern 142q is adhesion, and thus the pitch of concavities and convexities of the second concave-convex pattern 142q can be smaller than that of the first concave-convex pattern 142p, as depicted in FIG. 13. As a different form from FIG. 13, the second concave-convex pattern 142q may be a pattern in which minute concavities and convexities are further provided on a surface of the concave-convex pattern, which has the pitch and depth (height) of concavities and convexities which are the same as those of the first concave-convex pattern. Allowing the adhesive layer 103 to adhere to the surface having the second concave-convex pattern 142q provides the following effects. Namely, "catching" and the like makes mechanical releasing (mechanical exfoliation) more difficult and concavities and convexities increase an interface area. Such effects strengthen the adhesion (connection) between the base member 40 and the adhesive layer 103. As a result, the organic layer 94 is sealed more reliably. Further, the high adhesive force is maintained for a long period of time after the sealing and no exfoliation occurs. Such high adhesive force allows the adhesive layer 103 to have a narrower line width, thereby making it possible to increase an area of the organic layer (light emitting part).

[Second Modified Embodiment of Light Emitting Element]

Figure 14:
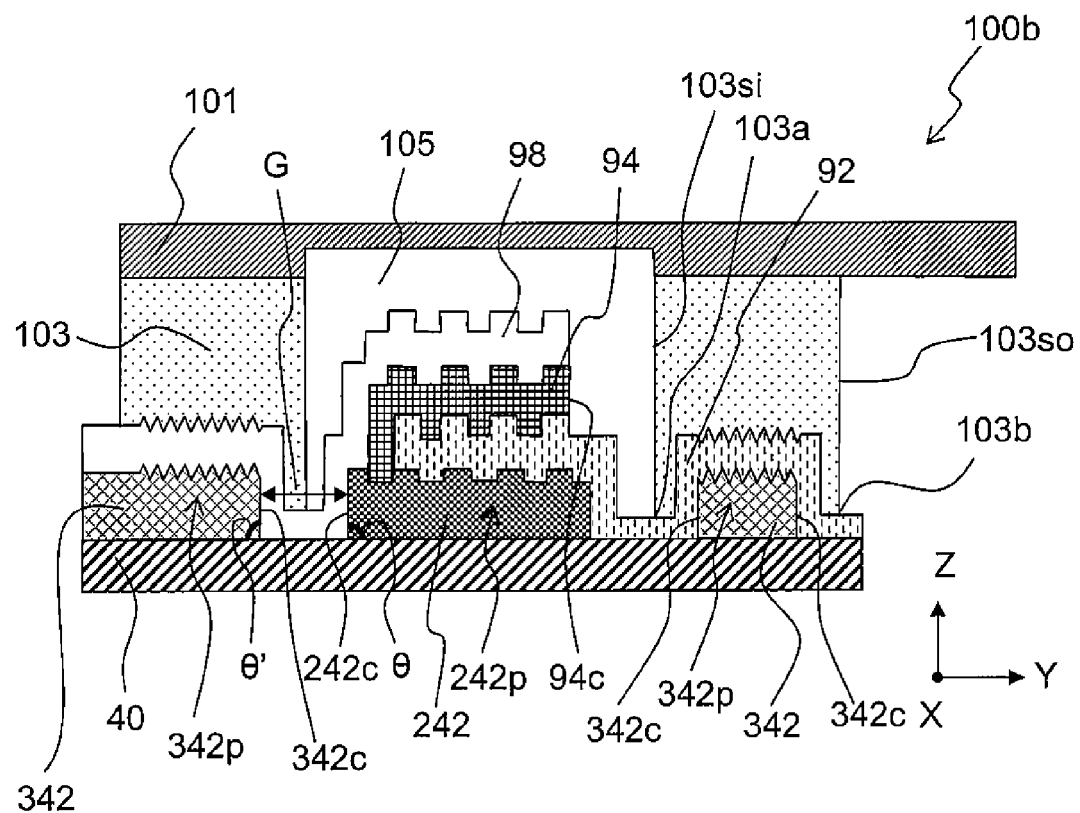
FIG. 14 is a schematic cross-sectional view of a light emitting element of the second modified embodiment.

An explanation will be made about a light emitting element 100b of another modified embodiment. As depicted in FIG. 14, the light emitting element 100b includes the plate-shaped base member 40, the sealing member 101 which is disposed to face a surface of the base member 40 with the space 105 intervening therebetween, the first electrode 92, the organic layer 94, the second electrode 98, and the adhesive layer 103, similarly to the light emitting element 100. The light emitting element 100b further includes a first concave-convex structure layer 242 having a first concave-convex pattern 242p formed in a surface thereof and a second concave-convex structure layer 342 having a second concave-convex pattern 342p formed in a surface thereof. As depicted in FIG. 14, an in-plane direction of the base member 40 is defined as an XY direction and a direction perpendicular to the XY direction, namely, a height direction of the light emitting element 100b is defined as a Z direction.

Materials of the base member 40, the sealing member 101, the first electrode 92, the organic layer 94, the second electrode 98, and the adhesive layer 103 of the light emitting element 101b are identical to materials of those of the light emitting element 100. The first concave-convex structure layer 242 and the second concave-convex structure layer 342 are made of the same material as that of the concave-convex structure layer 142 of the light emitting element 100. In view of easy manufacturing, it is preferred that the material of the first concave-convex structure layer 242 be identical to the material of the second concave-convex structure layer 342.

The first concave-convex structure layer 242 is formed on the base member 40 and has a rectangular shape of which planar structure (a structure or a shape in an XY plane) which is smaller to some extent than that of the base member 40. An outer periphery 242c of the first concave-convex structure layer 242 is positioned within the planar shape (planar area) of the base member 40. In the space 105, the first concave-convex structure layer 242, the first electrode 92, the organic layer 94, and the second electrode 98 are formed on the base member 40 in that order. The second concave-convex structure layer 342 is formed on the base member 40 around the first concave-convex structure layer 242 with a predetermined distance G from the outer periphery 242c of the first concave-convex structure layer 242.

Similar to the light emitting element 100, the adhesive layer 103 of the light emitting element 100b is a rectangular frame body having an opening at its center in the XY plane. The adhesive layer 103 is disposed in a state of being sandwiched between the base member 40 and the sealing member 101 in the height direction (Z direction). In this configuration or arrangement, the inner circumferential surface 103si of the adhesive layer 103 constituting the frame body defines the space 105, and the outer circumferential surface 103so of the adhesive layer 103 constituting the frame body defines a boundary, which is parallel to the height direction of the light emitting element 100b, between the adhesive layer and an external space. A part, of the outer circumferential surface 103so of the adhesive layer 103, which makes contact with the base member 40 or any one of the layers formed thereon is referred to as the outer periphery 103b of the adhesive layer 103, and a part, of the inner circumferential surface 103si of the adhesive layer 103, which makes contact with the base member 40 or any one of the layers formed thereon is referred to as the inner periphery 103a of the adhesive layer 103 (see FIG. 14).

In the light emitting element 100b, the outer periphery 242c of the first concave-convex structure layer 242 is disposed only inside the outer periphery 103b of the adhesive layer 103 (on the side of the sealed space 105) in the XY plane, i.e., the outer periphery 242c of the first concave-convex structure layer 242 is not disposed outside the outer periphery 103b of the adhesive layer 103. Although FIG. 14 depicts the configuration in which the outer periphery 242c of the first concave-convex structure layer 242 is disposed inside the inner periphery 103a of the adhesive layer 103 (on the side close to the sealed space 105), the outer periphery 242c of the first concave-convex structure layer 242 may be disposed between the inner periphery 103a and the outer periphery 103b of the adhesive layer 103.

The second concave-convex structure layer 342 is disposed not to penetrate the adhesive layer 103. More specifically, the second concave-convex structure layer 342 is disposed not to penetrate both the outer periphery 103b and the inner periphery 103a of the adhesive layer 103 within the XY plane (i.e., not to extend beyond the distance between the outer periphery 103b and the inner periphery 103a of the adhesive layer 103 within the XY plane). Namely, side surfaces 342c of the second concave-convex structure layer 342 are disposed not to extend out of both the inside (the side close to the sealed space 105) and the outside of the adhesive layer 103. For example, as depicted on the right side of FIG. 14, the second concave-convex structure layer 342 may be formed between the inner periphery 103a and the outer periphery 103b of the adhesive layer 103; and as depicted on the left side of FIG. 14, the second concave-convex structure layer 342 may be formed to range from a position between the inner periphery 103a and the outer periphery 103b of the adhesive layer 103 to the outside (outside of the sealed space 105) of the outer periphery 103b of the adhesive layer 103. As a different form from FIG. 14, the second concave-convex structure layer 342 may be formed to range from a position between the inner periphery 103a and the outer periphery 103b of the adhesive layer 103 to the inside of the inner periphery 103a of the adhesive layer 103 (the side of the sealed space 105). The second concave-convex structure layer 342 may be an aggregate having independent concave-convex layers which are not connected to each other. In this case, each of the concave-convex layer may be disposed not to penetrate both the outer periphery 103b and the inner periphery 103a of the adhesive layer 103 within the XY plane (Le., not to extend beyond the distance between the outer periphery 103b and the inner periphery 103a of the adhesive layer 103 within the XY plane). As long as such a condition is satisfied, the second concave-convex structure layer 342 may be formed of any or all of: the concave-convex layer disposed only in the position between the inner periphery 103a and the outer periphery 103b of the adhesive layer 103; the concave-convex layer disposed to range from the position between the inner periphery 103a and the outer periphery 103b of the adhesive layer 103 to the outside of the outer periphery 103b; and the concave-convex layer disposed to range from the position between the inner periphery 103a and the outer periphery 103b of the adhesive layer 103 to the inside of the inner periphery 103a.

In the above configuration or arrangement, the first concave-convex layer 242 and the second concave-convex layer 342 are not allowed to penetrate the adhesive layer 103, and thus moisture and oxygen are prevented from penetrating through the first concave-convex structure layer 242 and/or the second concave-convex structure layer 342 and entering the sealed space 105. Thus, the deterioration of the organic layer 94 and the like is prevented and the service life of the light emitting element 100b is improved. Further, the adhesive layer 103 may adhere to the concave-convex surface (second concave-convex pattern) 342p of the second concave-convex structure layer 342 or the concave-convex surface of the first electrode 92, the organic layer 94 or the second electrode 98, which reflects the second concave-convex pattern 342p. Allowing the adhesive layer 103 to adhere to the concave-convex surfaces provides high adhesive force between the adhesive layer 103 and the base member 40 and the high adhesive force (connecting force) is maintained for a long period of time after the sealing. Thus, no exfoliation occurs and the service life of the light emitting element 100b improves. In this embodiment, even when the adhesion layer 103 is applied with accompanying some positional deviation, no problem occurs as long as the first concave-convex structure layer 242 and the second concave-convex structure layer 342 does not penetrate the adhesive layer 103. Thus, the control of coating (application) position of the adhesive layer is easy and the light emitting element having high reliability can be produced at a high yield.

In the light emitting element 100b, the outer periphery (side surface) 242c of the first concave-convex structure layer 242 and/or the side surfaces 342c of the second concave-convex structure layer 342 may be an inclined surface in which an angle θ (θ'), which is formed by the outer periphery 242c (side surface 342c) and the surface of the base member 40, is not more than 80°. This configuration allows each of the first electrode 92 and the second electrode 98 to be formed in a uniform thickness on the outer periphery (side surface) 242c of the first concave-convex structure layer 242, the side surfaces of the second concave-convex structure layer 342, and the vicinities thereof, thereby preventing any failure such as breaking or disconnecting of electrodes.

In addition to the irregular concave-convex pattern as described above, the first concave-convex pattern 242p and the second concave-convex pattern 342p may be any pattern such as a dot structure; a prism structure; a stripe structure formed of lines and spaces; a pillar structure such as a cylindrical shape, a conical shape, a truncated cone shape, a triangle pole shape, a triangular pyramid shape, a truncated triangular pyramid shape, a square pole shape, a quadrangular pyramid shape, a truncated quadrangular pyramid shape, a polygonal column shape, a polygonal pyramid shape, or a truncated polygonal pyramid shape; or a hole structure. Alternatively, the first concave-convex pattern 242p and the second concave-convex pattern 342p may be an irregular minute concave-convex pattern formed by a sandblasting method. As depicted in FIG. 14, the second concave-convex pattern 342p may be different from the first concave-convex pattern 242p. It is especially preferred that the first concave-convex pattern 242p be an irregular structure (pattern) functioning as the diffraction grating and that the second concave-convex pattern 342p be a pattern capable of strongly adhering to the adhesive layer 103, for example, a pattern with a large surface area such as a pattern having a small pitch of concavities and convexities. The second concave-convex pattern 342p is not required to have the function as the diffraction grating. As a different form from FIG. 13, the second concave-convex pattern 342p may be a pattern in which minute concavities and convexities are further provided on a surface of the concave-convex pattern, which has the pitch and depth (height) of concavities and convexities which are the same as those of the first concave-convex pattern 242p. Allowing the adhesive layer 103 to adhere to the surface having the second concave-convex pattern 342p provides the following effects. Namely, "catching" and the like makes mechanical releasing (mechanical exfoliation) more difficult and concavities and convexities increase an interface area. Such effects strengthen the adhesion (connection) between the base member 40 and the adhesive layer 103. As a result, the organic layer 94 is sealed more reliably. Further, the high adhesive force is maintained for a long period of time after the sealing and no exfoliation occurs. Such high adhesive force allows the adhesive layer 103 to have a narrower line width, thereby making it possible to increase an area of the organic layer (light emitting part). As a different form from FIG. 14, the second concave-convex pattern 342p may be identical to the first concave-convex pattern 242p.

[Method for Manufacturing Light Emitting Element]

Subsequently, an explanation will be made about a method for manufacturing the light emitting element 100 of the above embodiment. The manufacturing method mainly includes a step for manufacturing (forming) a stacked body including the light emitting part of the light emitting element and a sealing step for sealing the stacked body with the sealing member and the adhesive layer. At first, the concave-convex structure layer is formed on the base member. The concave-convex structure layer can be formed, for example, by a lift-off method or UV curing method as described below.

The lift-off method is usable when the concave-convex structure layer is formed by using a sol-gel material, a thermosetting material such as a thermosetting resin, or a photocurable material. In the following, the case in which the concave-convex structure layer is formed by using the sol-gel material will be explained as an example. The lift-off method mainly includes: a step for forming a resist pattern on the base member; a step for preparing a solution of the sol-gel material; a step for coating the base member with the solution of the sol-gel material; a step for pressing a mold having a transfer pattern thereon against the coating film which has been dried for a predetermined time; a pre-baking step for subjecting the coating film pressed with the mold to the pre-baking; a releasing (exfoliation or peeling off) step for releasing (peeling) the mold from the coating film; a main baking step for subjecting the coating film to the main baking; and a step for removing the resist from the base member. The steps will be explained below with reference to FIG. 3.

<Step for Forming Resist Pattern>

Figure 3A:
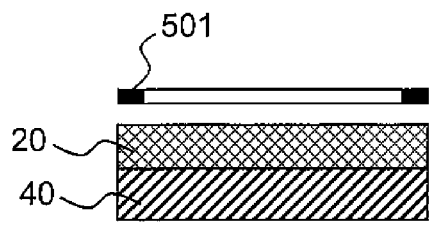
FIGS. 3A to 3G conceptually depict a concave-convex structure layer formation process by a liftoff method.

As depicted in FIG. 3A, a cleaned base member 40 is coated with a resist 20. It is allowable to perform a surface treatment or provide an easy-adhesion layer on the base member 40 in order to improve an adhesion property, and to provide a gas barrier layer in order to keep out moisture and gas such as oxygen. Any photoresist may be used as the resist 20. As the coating method for the resist 20, it is possible to use any coating method including, for example, a bar coating method, a spin coating method, a spray coating method, a dip coating method, a die coating method, and an ink-jet method. The bar coating method, the die coating method, and the spin coating method are preferable, because the base member having a relatively large area can be coated uniformly with the resist and the coating can be quickly completed.

Figure 3B:
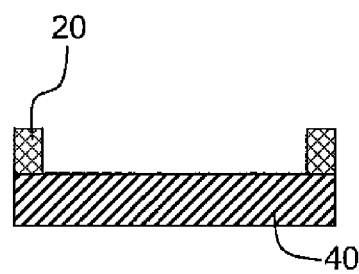

After the resist 20 applied on the base member 40 is dried, the resist 20 is exposed to light using a mask 501, as depicted in FIG. 3A. Developing the resist 20 with a developer removes a part, of resist, in the position in which the concave-convex structure layer is to be formed, as depicted in FIG. 3B. It is preferred that the resist be patterned such that a cross section shape of the residual resist 20 has an inverted taper shape in which the cross section area of the residual resist 20 increases from the interface with the base member toward the resist surface by, for example, a method as described in Japanese Patent No. 2,989,064. Such patterning makes an edge (periphery) of the resist 20 an inclined surface, thereby making it possible to make the outer periphery 142c of the concave-convex structure layer the inclined (tapered) surface.

<Sol-Gel Material Preparation Step>

The sol-gel material (sol), which is a material of the concave-convex structure layer, is prepared. For example, when silica is synthesized on the base member by the sol-gel method, a sol-gel material of metal alkoxide (silica precursor) is prepared. Examples of the silica precursor include tetraalkoxide monomers represented by tetraalkoxysilane such as tetramethoxysilane (TMOS), tetraethoxysilane (TEOS), tetra-i-propoxysilane, tetra-n-propoxysilane, tetra-i-butoxysilane, tetra-n-butoxysilane, tetra-sec-butoxysilane, and tetra-t-butoxysilane; trialkoxide monomers represented by trialkoxysilane such as methyltrimethoxysilane, ethyltrimethoxysilane, propyltrimethoxysilane, isopropyltrimethoxysilane, phenyltrimethoxysilane, methyltriethoxysilane, ethyltriethoxysilane, propyltriethoxysilane, isopropyltriethoxysilane, phenyltriethoxysilane, methyltripropoxysilane, ethyltripropoxysilane, propyltripropoxysilane, isopropyltripropoxysilane, phenyltripropoxysilane, methyltriisopropoxysilane, ethyltriisopropoxysilane, propyltriisopropoxysilane, isopropyltriisopropoxysilane, phenyltriisopropoxysilane, hexyltrimethoxysilane, hexyltriethoxysilane, decyltrimethoxysilane, trifluoropropyltrimethoxysilane, octyltriethoxysilane, perfluorodecyltriethoxysilane, 4-trifluoro methylphenyltriethoxysilane, and tolyltriethoxysilane; dialkoxide monomers represented by dialkoxysilane such as dimethyldimethoxysilane, dimethyldiethoxysilane, dimethyldipropoxysilane, dimethyldiisopropoxysilane, dimethyldi-n-butoxysilane, dimethyldi-i-butoxysilane, dimethyldi-sec-butoxysilane, dimethyldi-t-butoxysilane, diethyldimethoxysilane, diethyldiethoxysilane, diethyldipropoxysilane, diethyldiisopropoxysilane, diethyldi-n-butoxysilane, diethyldi-i-butoxysilane, diethyldi-sec-butoxysilane, diethyldi-t-butoxysilane, dipropyldimethoxysilane, dipropyldiethoxysilane, dipropyldipropoxysilane, dipropyldiisopropoxysilane, dipropyldi-n-butoxysilane, dipropyldi-i-butoxysilane, dipropyldi-sec-butoxysilane, dipropyldi-t-butoxysilane, diisopropyldimethoxysilane, diisopropyldiethoxysilane, diisopropyldipropoxysilane, diisopropyldiisopropoxysilane, diisopropyldi-n-butoxysilane, diisopropyldi-i-butoxysilane, diisopropyldi-sec-butoxysilane, diisopropyldi-t-butoxysilane, diphenyldimethoxysilane, diphenyldiethoxysilane, diphenyldipropoxysilane, diphenyldiisopropoxysilane, diphenyldi-n-butoxysilane, diphenyldi-i-butoxysilane, diphenyldi-sec-butoxysilane, and diphenyldi-t-butoxysilane; monomers having vinyl group such as vinyltrimethoxysilane and vinyltriethoxysilane; monomers having epoxy group such as 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane; monomers having styryl group such as p-styryltrimethoxysilane; monomers having methacrylic group such as 3-methacryloxypropylmethyldimethoxysilane, 3-methacryloxypropyltrimethoxysilane, 3-methacryloxypropylmethyldiethoxysilane, and 3-methacryloxypropyltriethoxysilane; monomers having acrylic group such as 3-acryloxypropyltrimethoxysilane; monomers having amino group such as N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, and N-phenyl-3-aminopropyltrimethoxysilane; monomer having ureide group such as 3-ureidepropyltriethoxysilane; monomers having mercapto group such as 3-mercaptopropylmethyldimethoxysilane and 3-mercaptopropyltrimethoxysilane; monomers having sulfide group such as bis(triethoxysilylpropyl) tetrasulfide; monomers having isocyanate group such as 3-isocyanatopropyltriethoxysilane; polymers obtained by polymerizing the foregoing monomers in small amounts; and composite materials characterized in that functional group and/or polymer is/are introduced into a part of the material as described above. Further, a part of or all of the alkyl group and the phenyl group may be substituted with fluorine. Further, examples of the silica precursor include metal acetylacetonate, metal carboxylate, oxychloride, chloride, and mixtures thereof The silica precursor, however, is not limited to the above examples. In addition to Si, examples of the metal species include Ti, Sn, Al, Zn, Zr, In, and mixtures thereof; but are not limited thereto. It is also possible to use any appropriate mixture of precursors of the oxides of the above metals. Further, a hydrophobization treatment may be performed on each of the surfaces. Any known method for the hydrophobization treatment may be used. For example, in a case of the surface of silica, the hydrophobization treatment can be performed with dimethyldichlorosilane, trimethylalkoxysilan, etc., or with a silicone oil and a trimethylsilylating agent such as hexamethyldisilazane. Alternatively, it is also allowable to employ a surface treatment method for a surface of metal oxide powder with supercritical carbon dioxide. Further, it is possible to use, as the silica precursor, a silane coupling agent having, in its molecule, a hydrolysis group having the affinity and the reactivity with silica and an organic functional group having the water-repellence. For example, there are exemplified by silane monomer such as n-octyltriethoxysilane, methyltriethoxysilane, and methyltrimethoxysilane; vinylsilane such as vinyltriethoxysilane, vinyltrimethoxysilane, vinyltris(2-methoxyethoxy)silane, and vinylmethyldimethoxysilane; methacrylsilane such as 3-methacryloxypropyltriethoxysilane and 3-methacryloxypropyltrimethoxysilane; epoxysilane such as 2-(3,4-epoxycyclohexyl)ethyltrimethoxysilane, 3-glycidoxypropyltrimethoxysilane, and 3-glycidoxypropyltriethoxysilane; mercaptosilane such as 3-mercaptopropyltrimethoxysilane and 3-mercaptopropyltriethoxysilane; sulfursilane such as 3-octanoylthio-1-propyltriethoxysilane; aminosilane such as 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, and 3-(N-phenyl)-aminopropyltrimethoxysilane; and polymers obtained by polymerizing the monomers as described above.

Each of the sol-gel materials produces amorphous silica by being subjected to hydrolysis and polycondensation reaction. An acid such as hydrochloric acid or an alkali such as ammonia is added in order to adjust the pH of the solution as a synthesis condition. A material (photoacid generator or photobase generator), which generates an acid or alkali by irradiation with light such as ultraviolet rays, may be added. The pH is preferably not more than 4 or not less than 10. Water may be added to perform the hydrolysis. The amount of water to be added can be not less than 1.5 times, with respect to the amount of metal alkoxide species, in the molar ratio. It is also possible to use, as the sol-gel material, a material other than the silica. For example, a titanium-based material, a material based on indium tin oxide (ITO), $Al_2O_3$, $ZrO_2$, ZnO, $TiO_2$, ZnS, ZrO, $BaTiO_3$, $SrTiO_2$, etc. may be used.

Those usable as the solvent for the sol-gel material include, for example, alcohols such as methanol, ethanol, isopropyl alcohol (IPA), and butanol; aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycols such as ethylene glycol and propylene glycol; glycol ethers such as ethylene glycol dimethyl ether, diethylene glycol dimethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; hetero-element containing compounds such as carbon disulfide; water; and mixture solvents thereof. Especially, ethanol and isopropyl alcohol are preferable. Further, a mixture of water and ethanol and a mixture of water and isopropyl alcohol are also preferable.

As an additive of the sol-gel material, it is possible to use polyethylene glycol, polyethylene oxide, hydroxypropylcellulose, and polyvinyl alcohol for viscosity adjustment; alkanolamine such as triethanolamine, β-diketone such as acetylacetone, β-ketoester, formamid, dimetylformamide, dioxane, and the like, as a solution stabilizer.

<Sol-Gel Material Coating Step>

Figure 3C:
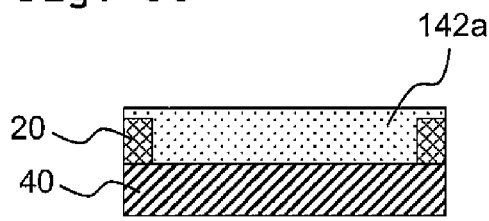

As depicted in FIG. 3C, the base member 40 is coated with the prepared sol-gel material to form a coating film 142a. As the coating method, it is possible to use any coating method including, for example, a bar coating method, a spin coating method, a spray coating method, a dip coating method, a die coating method, and an ink jet method. The bar coating method, the die coating method, and the spin coating method are preferable, because the base member having a relatively large area can be coated uniformly with the sol-gel material and the coating can be quickly completed prior to curing (gelation) of the sol-gel material.

After the coating of the base member with the sol-gel material, the base member is kept (held) in the atmospheric air or reduced pressure in order to evaporate the solvent contained in the coating film 142a. After the coating of the base member with the sol-gel material, the polymerization reaction of the precursor proceeds as the evaporation of the solvent proceeds, and the physical property such as the viscosity of sol-gel material also changes in a short time. From the viewpoint of the stability of concave-convex pattern formation, it is preferred that drying time which enables a good pattern transfer have a sufficiently wide range. The range of the drying time which enables a good pattern transfer can be adjusted by the drying temperature (holding temperature), the drying pressure, the kind of sol-gel material, the ratio of mixed sol-gel materials, the solvent amount used at the time of preparation of the sol-gel material (concentration of sol-gel material), etc. It is preferred that the holding temperature stay constant in a range of 10 to 100° C., more preferably in a range of 10 to 30° C. When the holding temperature is higher than this range, the gelation reaction of the coating film 142a proceeds rapidly before the pressing step, which is not preferable. When the holding temperature is lower than this range, the gelation reaction of the coating film 142a proceeds slowly before the pressing step, which reduces the productivity and is not preferable.

<Pressing Step>

Figure 3D:
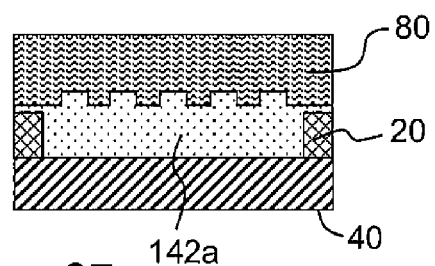

After the drying step, a mold 80 having a predetermined minute concave-convex pattern is pressed against the coating film 142a, as depicted in FIG. 3D. The pressing is performed by the conventional pressing system or a rolling system using a pressing roll.

<Mold Used in Pressing Step and Method for Producing Mold>

The mold 80 used in this embodiment may be a film-shape mold which is flexible and has a concave-convex transfer pattern on a surface thereof. Those usable as the material for the mold 80 include, for example, organic materials such as silicone resin, polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate; metallic materials such as nickel, copper, and aluminium; and inorganic materials such as glass. The materials for the mold 80 are not limited to the above examples, and any material can be used. The concave-convex pattern may be formed directly in each of the materials, or may be formed of another material with which the base member formed of the above-material(s) is coated or covered. It is possible to use photocurable resin, thermosetting resin, and thermoplastic resin as another material. A surface treatment or an easy-adhesion treatment may be performed between the base member and another material in order to improve the adhesion property. Further, a mold-release treatment may be performed on each concave-convex pattern surface as needed.

The concave-convex pattern of the mold 80 may be formed by any method. For example, the concave-convex pattern of the mold 80 may be any pattern such as a microlens array structure or a structure having the light scattering function, light diffracting function, etc. The concave-convex pattern may be, for example, an irregular concave-convex pattern in which pitches of concavities and convexities are non-uniform and orientations of concavities and convexities have no directionality. In order that the concave-concave structure layer to which the concave-convex pattern of the mold 80 has been transferred works as the diffraction grating, the average pitch of concavities and convexities of the mold 80 is preferably in a range of 100 to 1,500 nm. When the average pitch of concavities and convexities is less than the lower limit, pitches are so small relative to the wavelengths of the visible light that the diffraction of light by concavities and convexities of the concave-concave structure layer to which the concave-convex pattern of the mold 80 has been transferred is not likely to occur. On the other hand, when the average pitch exceeds the upper limit, the diffraction angle is so small that the functions as the diffracting grating are more likely to be lost. The average pitch of concavities and convexities is more preferably in a range of 200 to 1,200 nm. The average value of depth distribution of concavities and convexities of the mold 80 is preferably in a range of 20 to 200 nm. When the average value of the depth distribution of concavities and convexities is less than the lower limit, the height is so short relative to the wavelengths of the visible light that the required diffraction is less likely to occur. On the other hand, when the average value exceeds the upper limit, the intensity of diffracted light becomes non-uniform, which in turn results in the following tendency. Namely, the electric field distribution in the light emitting layer of the resulting light emitting element becomes non-uniform, thereby causing the electric field to concentrate on a certain position or area in the light emitting layer and thus causing any leak current to be easily generated, and/or shortening the service life. The average value of the depth distribution of concavities and convexities is more preferably in a range of 30 to 150 nm. The standard deviation of depth of convexities and concavities is preferably in a range of 10 to 100 nm. When the standard deviation of depth of convexities and concavities is less than the lower limit, the height is so short relative to the wavelengths of the visible light that the required diffraction is less likely to occur. On the other hand, when the standard deviation exceeds the upper limit, the intensity of diffracted light becomes non-uniform, which in turn results in the following tendency. Namely, the electric field distribution in the light emitting layer of the resulting light emitting element becomes non-uniform, thereby causing the electric field to concentrate on a certain position or area in the light emitting layer and thus causing any leak current to be easily generated, and/or shortening the service life. The standard deviation of depth of convexities and concavities is more preferably in a range of 15 to 75 nm.

An explanation will be made about an exemplary method for producing the mold 80 used in this embodiment. A master block pattern for forming the concave-convex pattern of the mold is manufactured first. It is preferred that the concave-convex pattern of the master block be formed by a method of utilizing the self-organization or self-assembly (micro phase separation) of a block copolymer by heating, as described in International Publication No. WO2012/096368 of the applicants of the present invention (hereinafter referred to as "BCP (Block Copolymer) thermal annealing method" as appropriate), a method of heating and cooling a vapor deposited film on a polymer film to form concavities and convexities of wrinkles on a surface of polymer, as disclosed in International Publication No. WO2011/007878 A1 of the applicants of the present invention (hereinafter referred to as "BIM (Buckling) method" as appropriate), or a method of utilizing the self-organization or self-assembly of a block copolymer under a solvent atmosphere (hereinafter referred to as "BCP solvent annealing method" as appropriate) which will be described below. The photolithography method may be utilized instead of the BCP thermal annealing method, BKL method and BCP solvent annealing method. In addition to the above methods, examples of the method for manufacturing the concave-convex pattern of the master block include microfabrication or fine-processing methods including a cutting (cutting and processing) or machining method, an electron-beam direct imaging method, a particle beam processing method, a scanning probe processing method, and the like; a fine-processing method using the self-organization or self-assembly of fine particles; and a sandblasting method. When the pattern is formed by the BCP thermal annealing method or the BCP solvent annealing method, although the pattern made of any material can be used, the material is preferably a block copolymer composed of a combination of two selected from the group consisting of a styrene-based polymer such as polystyren; polyalkyl methacrylate such as polymethyl methacrylate; polyethylene oxide; polybutadiene; polyisoprene; polyvinylpyridine; and polylactic acid.

The BCP solvent annealing method is a method as follows. Namely, a thin film of the block copolymer which has been applied on a substrate and dried is subjected to a solvent annealing (solvent phase separation) process under an atmosphere of vapor of an organic solvent to form a phase separation structure of the block copolymer in the thin film, instead of performing the first heating step, the etching step and the second heating step in the BCP thermal annealing method described in WO2012/096368. With this solvent annealing process, the self-organization of the block copolymer is advanced, and the block copolymer undergoes the micro phase separation into the concave-convex structure.

For example, the solvent annealing process can be carried out by providing the atmosphere of vapor of the organic solvent inside a tightly sealable container such as a desiccator, and exposing the thin film of the block copolymer as the objective under this atmosphere. The concentration of vapor of the organic solvent is preferably high for the purpose of promoting the phase separation of the block copolymer, in particular, it is preferred that the concentration of the organic solvent vapor be a concentration in which the pressure of the organic solvent vapor is saturated vapor pressure, wherein not only the phase separation of the block copolymer is promoted but also the concentration of the organic solvent vapor can be controlled or managed relatively easily. For example, when the organic solvent is chloroform, the saturated vapor amount (quantity) is known to be in a range of 0.4 g/l to 2.5 g/l at room temperature (0 to 45° C.). If the time of the organic solvent annealing process using chloroform or the like is excessively long, there is such a tendency that polyethylene oxide is deposited on the surface of the coating film and/or the concave-convex shape (pattern) formed by the phase separation is collapsed (loosened). The treatment time of the solvent annealing process may be 6 to 168 hours, preferably 12 to 48 hours, and more preferably 12 to 36 hours. If the time of the process is excessively long, the concave-convex shape is collapsed. If the time of the process is excessively short, grooves of the concave-convex structure are shallow and a part or member produced by transferring the concave-convex pattern of the manufactured mold has an insufficient light diffraction effect.

The organic solvent used in the solvent annealing process is preferably an organic solvent of which boiling point is in a range of 20 to 120° C. it is possible to use, for example, chloroform, dichloromethane, toluene, tetrahydrofuran (THF), acetone, carbon disulfide, and mixture solvents thereof Among these solvents, chloroform, dichloromethane, acetone, and a mixture solvent of acetone/carbon disulfide are preferable. The atmosphere temperature of the solvent annealing is preferably in a range of 0 to 45° C. If the atmosphere temperature of the solvent annealing is higher than 45° C., the concave-convex structure formed on the thin film is blunt or dull (loosened), causing the concave-convex structure to be collapsed easily. In an environment lower than 0° C., the organic solvent is hardly evaporated, and the phase separation of the block copolymer hardly occurs.

It is allowable to perform the heating process to the concave-convex structure of the thin film obtained by the solvent annealing process. Since the concave-convex structure has been already formed by the solvent annealing process, the heating process is performed to loosen or smooth the formed concave-convex structure. Note that the heating process is not necessarily required. The heating process may be useful when any protrusion is generated on a part of the surface of the concave-convex structure after the solvent annealing process on account of any cause and/or when it is intended to adjust the cycle (period or pitch) and the height of the concave-convex structure. For example, the heating temperature can be not less than the glass transition temperatures of the polymer segments constituting the block copolymer. For example, the heating temperature can be not less than the glass transition temperatures of the homopolymers and not more than a temperature higher than the glass transition temperatures by 70° C. The heating process can be performed in the atmosphere of the atmospheric air by using, for example, an oven. Further, the concave-convex structure of the thin film obtained by the solvent annealing process may be subjected to etching by irradiation with energy rays represented by ultraviolet rays such as excimer UV light, or etching by a dry etching method such as reactive ion etching (RIE). The concave-convex structure of the thin film which has been subjected to the etching may be subjected to the heating process.

After forming the master block with the pattern by means of the BCP thermal annealing method, BIC. method, or BCP solvent annealing method, further, a mold to which the pattern is transferred can be formed by an electroforming method or the like, as follows. At first, a seed layer functioning as an electro conductive layer for an electroforming process can be formed on the master block, which has the pattern to be transferred, by means of non-electrolytic plating, sputtering, vapor deposition, or the like. The thickness of the seed layer is preferably not less than 10 nm to uniformize a current density during the subsequent electroforming process, and thereby making the thickness of a metal layer accumulated by the subsequent electroforming process uniform. Those usable as the material of the seed layer include, for example, nickel, copper, gold, silver, platinum, titanium, cobalt, tin, zinc, chrome, gold-cobalt alloy, gold-nickel alloy, boron-nickel alloy, solder, copper-nickel-chromium alloy, tin-nickel alloy, nickel-palladium alloy, nickel-cobalt-phosphorus alloy, and alloy thereof. Subsequently, the metal layer is accumulated on the seed layer by the electroforming (electroplating). The entire thickness of the metal layer including the thickness of the seed layer can be, for example, in a range of 10 to 3000 μm. As the material of the metal layer accumulated by the electroforming, it is possible to use any of metal species as described above which can be used as the seed layer. Nickel is preferably used in view of the wear resistance, the releasing (exfoliation or peeling off) property, and the like as the mold of the metal substrate. In this case, nickel is preferably used also for the seed layer. Considering ease of the subsequent processes for forming the mold such as pressing to the resin layer, releasing, and cleaning, the formed metal layer desirably has appropriate hardness and thickness.

The metal layer including the seed layer obtained as described above is released (peeled off) from the master block having the concave-convex structure to obtain a metal substrate. As the releasing method, the metal layer may be peeled off physically, or materials composing the pattern of the master block may be dissolved and removed by using an organic solvent dissolving them, such as toluene, tetrahydrofuran (THF), and chloroform. When the metal substrate is peeled off from the master block, a remaining material component on the metal substrate can be removed by cleaning. As the cleaning method, it is possible to use wet cleaning using a surfactant etc., or dry cleaning using ultraviolet rays and/or plasma. Alternatively, for example, the remaining material component may be attached to or adhere to an adhesive agent or a bonding agent then be removed. Accordingly, the metal substrate to which the pattern has been transferred from the master block can be obtained.

A flexible mold such as the film-shaped mold can be manufactured by transferring the concave-convex structure (pattern) of the obtained metal substrate to a film-shaped supporting substrate. For example, after the supporting substrate is coated with curable resin, the resin layer is cured while the concave-convex structure of the metal substrate is being pressed against the resin layer. The supporting substrate is exemplified, for example, by base members made of inorganic materials such as glass; base members made of organic materials such as silicon resin, polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate; and metallic materials such as nickel, copper, and aluminium. The thickness of the supporting substrate may be in a range of 1 to 500 μm.

Examples of the curable resin include resins such as photocurable resins, thermosetting resins, moisture curing type resins, chemical curing type resins (two-liquid mixing type resins), etc. Specifically, the curable resin is exemplified by various resins including, for example, monomers, oligomers, and polymers of those based on epoxy, acrylic, methacrylic, vinyl ether, oxetane, urethane, melamine, urea, polyester, polyolefin, phenol, cross-linking type liquid crystal, fluorine, silicone, polyamide, etc. The thickness of the curable resin is preferably in a range of 0.5 to 500 μm. When the thickness is less than the lower limit, heights of concavities and convexities formed on the surface of the cured resin layer are likely to be insufficient. When the thickness exceeds the upper limit, the influence of volume change in the resin upon curing is likely to be so large that the formation of the shape of concavities and convexities is liable to be unsatisfactory.

As a method for coating the supporting substrate with the curable resin, for example, it is possible to adopt various coating methods such as a spin coating method, a spray coating method, a dip coating method, a dropping method, a gravure printing method, a screen printing method, a relief printing method, a die coating method, a curtain coating method, an ink-jet method, and a sputtering method. Further, conditions for curing the curable resin depend on the kind of the resin to be used. For example, the curing temperature is preferably in a range of room temperature to 250° C., and the curing time is preferably in a range of 0.5 minute to 3 hours. Alternatively, a method may be employed in which the curable resin is cured by being irradiated with energy rays such as ultraviolet light or electron beams. In such a case, the amount of the irradiation is preferably in a range of 20 mJ/cm$^2$ to 5 J/cm$^2$.

Subsequently, the metal substrate is detached from the curable resin layer after the curing. The method for detaching the metal substrate is not limited to a mechanical releasing (exfoliating or peeling off) method, and any known method can be adopted. Accordingly, it is possible to obtain the mold 80 with the resin film having the cured resin layer in which concavities and convexities are formed on the supporting substrate.

<Pre-Baking Step>

Figure 3E:
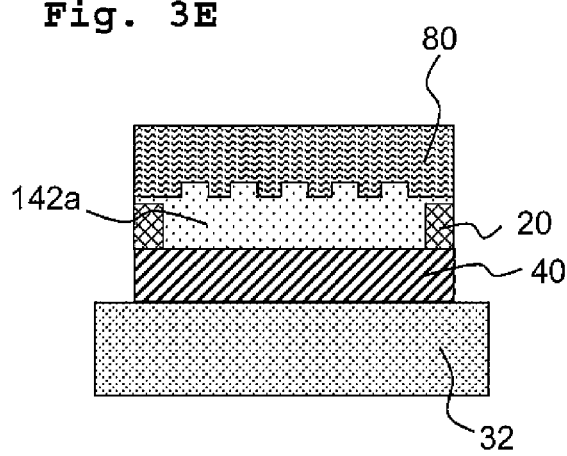

After the mold 80 is pressed against the coating film 142*a* made of the sol-gel material, the coating film 142*a* may be subjected to pre-baking by using a heater 32 as depicted in FIG. 3E. The pre-baking promotes the gelation of the coating film 142*a* to solidify the pattern, thereby making the pattern be less likely to be collapsed during the releasing or exfoliation. When the pre-baking is performed, the heating is preferably performed at a temperature in a range of 40 to 150° C. in the atmospheric air. As the heater 32, it is possible to use, for example, an infrared heater, hot-air heating, and a hot plate. It is not necessarily required to perform the pre-baking.

<Releasing Step>

After the pressing step or the pre-baking step, the mold 80 is released or peeled off from the coating film 142*a* made of the sol-gel material. As a method for releasing the mold 80, any known releasing method can be adopted. The mold 80 may be released while the coating film 142*a* being heated. In this case, gas generated from the coating film 142*a* is allowed to escape, thereby preventing generation of bubbles in the coating film 142*a*.

<Main Baking Step>

Figure 3F:
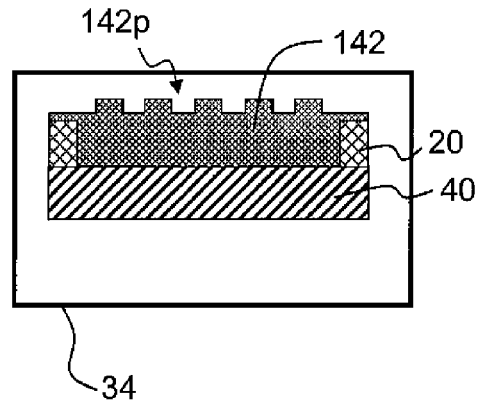

After the mold 80 is released from the coating film 142*a* on the base member 40, the coating film 142*a* is subjected to main baking, for example, in an oven 34, as depicted in FIG. 3F. The hydroxyl group and the like contained in the coating film 142*a* is desorbed or eliminated by the main baking to further harden (solidify) the coating film 142*a*. It is preferred that the main baking be performed at temperatures of 200 to 1,200° C. for about 5 minutes to about 6 hours. In such a manner, the coating film 142*a* is cured, and the concave-convex structure layer 142 having the concave-convex pattern 142*p* which corresponds to the concave-convex pattern of the mold 80 is obtained. In this situation, the coating film 142*a* is amorphous, crystalline, or in a mixture state of the amorphous and the crystalline, depending on the baking temperature and baking time. Further, when a material, which generates an acid or alkali by irradiation with light such as ultraviolet rays, is added to the sol-gel material, a step of curing the coating film 142*a*, in which the coating film 142*a* made of the sol-gel material is cured by irradiation with energy rays represented by ultraviolet rays such as excimer UV light, may be included in the concave-convex pattern transfer process.

<Resist Stripping Step>

Figure 3G:
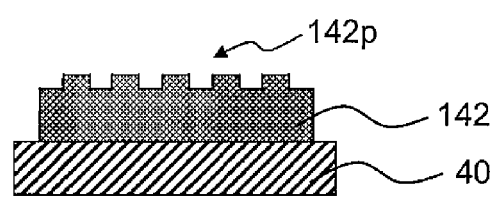

After the coating film 142*a* is cured to form the concave-convex structure layer 142, the resist 20 and the concave-convex structure layer 142 on the resist 20 are stripped and removed as depicted in FIG. 3G. The resist 20 is stripped by using any resist stripping liquid. As described above, the concave-convex structure layer 142 having a desired concave-convex pattern 142*p* is formed on the base member 40 by the liftoff method.

Instead of the liftoff method, the concave-convex structure layer 142 can be formed on the base member 40 by the UV curing method. The UV curing method can be used when the concave-convex structure layer is formed by using a UV curable resin, a sol-gel material containing a photoacid generator or the like. In the following, the case in which the concave-convex structure layer is formed by using the UV curable resin will be explained as an example with reference to FIG. 4. Instead of the UV curable resin, it is allowable to use, for example, the sol-gel material to which the photoacid generator such as hexafluorophosphate aromatic sulfonium salt which generates acid by light is added; the sol-gel material to which β-diketone represented by acetylacetone which forms chemical modification (chelation) which can be removed by being irradiated with light is added; and the like. Further, it is allowable that the concave-convex structure layer 142 be formed of a resin which can be cured by an active energy-ray other than the UV light, and the resin be irradiated with the active energy ray other than the UV light, instead of being irradiated with the UV light.

Figure 4A:
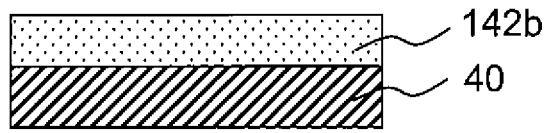
FIGS. 4A to 4E conceptually depict a concave-convex structure layer formation process by a UV curing method.

At first, as depicted in FIG. 4A, the cleaned base member 40 is coated with a UV curable resin 142*b*. It is allowable to perform a surface treatment or provide an easy-adhesion layer on the base member 40 in order to improve an adhesion property, and to provide a gas barrier layer in order to keep out moisture and gas such as oxygen. As a coating method of the UV curable resin, it is possible to use any coating method including, for example, a bar coating method, a spin coating method, a spray coating method, a dip coating method, a die coating method, and an ink jet method. The bar coating method, the die coating method, and the spin coating method are preferable, because the base member having a relatively large area can be coated uniformly with the UV curable resin and the coating can be quickly completed.

Figure 4B:
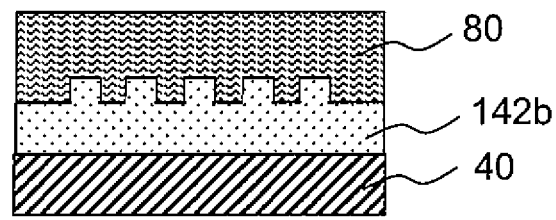
Figure 4C:
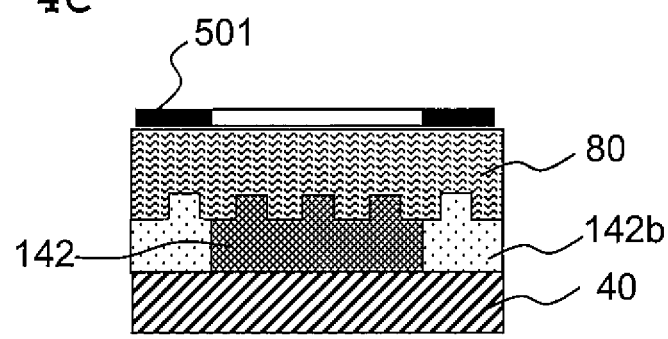
Figure 4D:
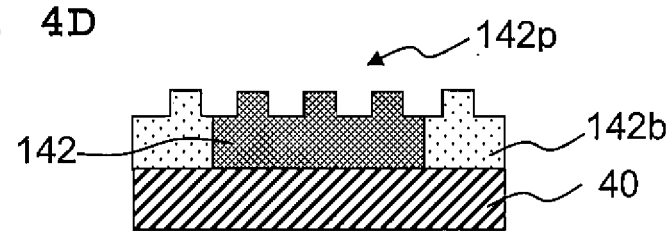

After the base member 40 is coated with the UV curable resin 142b, the mold 80 having the predetermined minute concave-convex pattern is pressed against the coating film 142b made of the UV curable resin, as depicted in FIG. 4B. The pressing can be performed by the conventional pressing system or the rolling system using the pressing roll. As the mold 80, one similar to the mold explained in the liftoff method can be used. After the pressing with the mold 80, the coating film 142b made of the UV curable resin is partially irradiated with UV light using an exposure mask 501 for the concave-convex structure layer, as depicted in FIG. 4C. Thus, the part, of the coating film 142b, exposed with the UV light is cured. A concave-convex pattern of the mold 80 is transferred to the cured coating film 142b. Arranging the exposure mask 501 and the mold 80 with a distance intervening therebetween during UV light irradiation allows the UV light to go around the lower side of light-shielding portions of the exposure mask 501, thereby making it possible to cure the UV curable resin into a tapered shape. In this case, the outer periphery 142c of the cured coating film remaining on the base member 40 after removal of an uncured coating film 142b as described later is formed as the inclined surface, and thus the concave-convex structure layer 142, of which outer periphery 142c is formed as the inclined surface, can be obtained.

A film-shaped mold, in which a film-shaped photomask is used as a supporting substrate, may be prepared, and the pressing and the exposure for the UV curable resin 142b may be performed using this film-shaped mold.

Figure 4E:
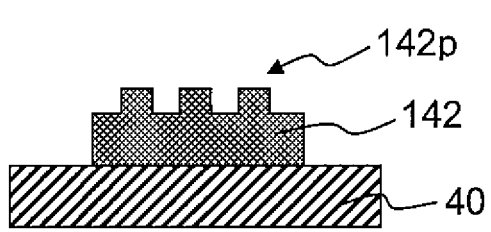

Subsequently, as depicted in FIG. 4B, the mold 80 is released from the coating film 142b and the concave-convex structure layer 142. After releasing of the mold 80, the uncured coating film 142b is removed. The removal of the uncured coating film 142b can performed such that the uncured coating film 142b is dissolved by a solvent, such as isopropyl alcohol (IPA). Removing the uncured coating film 142b in such a manner allows only the cured coating film 142b to remain on the base member as depicted in FIG. 4E, thereby forming the concave-convex structure layer 142 having the concave-convex pattern 142p, which corresponds to the concave-convex pattern of the mold 80.

Figure 5A:
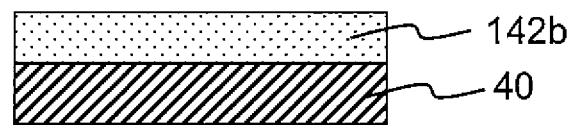
FIGS. 5A to 5C conceptually depict a concave-convex structure layer formation process by another aspect of the UV curing method.
Figure 5B:
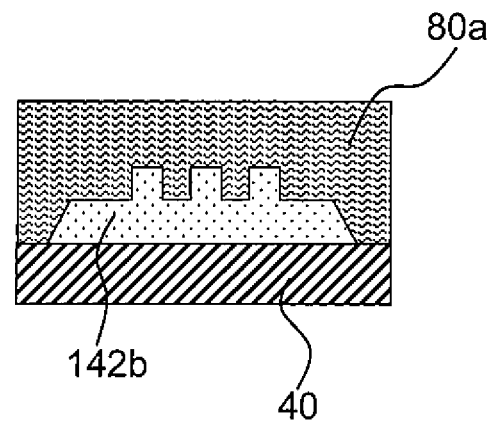
Figure 5C:
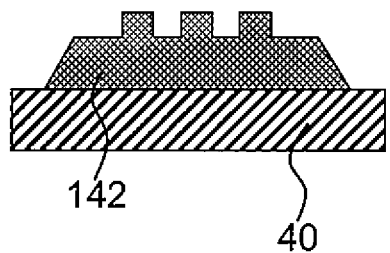

In the UV curing method, the concave-convex pattern of the concave-convex structure layer is formed by using the mold, and the unnecessary part(s) or portion(s) of the coating film made of the UV curable material is(are) removed through the curing by mask exposure and the dissolution. Instead of using the mold 80 depicted in FIG. 4B, a mold 80a including concave portions corresponding to the shape of the concave-convex structure layer 142 as depicted in FIG. 5B may be used to form the concave-convex structure layer 142 without the exposure by use of the mask and the dissolution of uncured UV curable resin. At first, as depicted in FIG. 5A, the base member 40 is coated with the UV curable resin 142b. Then, the mold 80a is pressed against the coating film 142b as depicted in FIG. 5B. After the pressing with the mold 80a, the coating film 142b is cured by being irradiated with UV light. After curing of the coating film 142b, the mold 80a is released from the coating film 142b and thus the concave-convex structure layer 142 having a shape which corresponds to the shape of the mold 80a is formed as depicted in FIG. 5C. In this case, when a part, of the mold 80a, corresponding to the outer periphery 142c of the concave-convex structure layer 142 is formed as an inclined surface, the outer periphery 142c of the concave-convex structure layer 142 is formed as the inclined surface. The material of the concave-convex structure layer 142 is not limited to the UV curable material, and may be a thermosetting material such as a sol-gel material. When the sol-gel material is used for the concave-convex structure layer 142, it is preferred that heating by use of a heater be performed instead of UV light irradiation, and main baking be performed after the releasing of the mold 80a.

<First Electrode Formation Step>

After the concave-convex structure layer is formed on the base member by the liftoff method or the UV curing method, the base member and the concave-convex structure layer are cleaned with a brush in order to remove foreign matters and the like adhered to the base member and the concave-convex structure layer, and then an organic matter and the like is removed with an organic solvent and an alkaline cleaning agent using an aqueous solvent. Next, as depicted in FIG. 1B, the first electrode 92 is stacked on the concave-convex structure layer 142 such that the concave-convex structure formed in the surface of the concave-convex structure layer 142 is maintained on the first electrode 92 (see FIG. 1B). The first electrode 92 having the concave-convex pattern is formed, accordingly. As a method for stacking the first electrode 92, it is possible to appropriately use any known method including, for example, an evaporation method, a sputtering method, and a spin coating method. Among these methods, the sputtering method is preferably employed from the viewpoint of improving the adhesion property. Note that during the sputtering, the base member may be exposed to a high temperature of about 300° C. The first electrode 92 is coated with photoresist, and then the photoresist is exposed with a mask pattern for the first electrode, and developed by a developer. After that, the first electrode is etched with an etching solution, thereby obtaining the patterned first electrode 92 having a predetermined pattern. It is preferred to clean the obtained first electrode 92 with the brush and to remove any organic matter and the like with the organic solvent and the alkaline cleaning agent using the aqueous solvent, followed by performing a UV ozone treatment.

<Organic Layer Formation Step>

Next, the organic layer 94 is stacked on the first electrode 92 (see FIG. 1B). As a method for stacking the organic layer 94, it is possible to appropriately use any known method including, for example, an evaporation method, a sputtering method, a spin coating method, and a die coating method. The patterning of the organic layer 94 can be performed by any known method such as patterning by use of a mask. As depicted in FIGS. 1A and 1B, the organic layer 94 is formed in a range or area narrower than that of the concave-convex structure layer 142 such that the outer periphery of the organic layer 94 and the outer periphery of the concave-convex structure layer 142 are positioned while being separated from each other by a predetermined distance. As a result, the concave-convex structure layer 142 is partially exposed without being covered with the organic layer 94 and/or a part (outer circumference) of the first electrode 92 in which concavities and convexities of the concave-convex structure layer 142 are maintained is exposed without being covered with the organic layer 94.

<Second Electrode Formation Step>

Subsequently, the second electrode (metal electrode) 98 is stacked on the organic layer 94. The metal electrode 98 can be stacked by any known method such as an evaporation method and a sputtering method. It is preferred that the metal electrode 98 be formed to cover the organic layer 94 entirely. The patterning of the metal electrode 98 can be performed by any known method such as patterning by use of a mask.

<Sealing Step>

Subsequently, the adhesive layer 103 is formed and the sealing member 101 is attached thereto, thereby forming the sealed space 105 (see FIGS. 1A and 1B). At first, the adhesive layer 103 is formed to overlap the outer periphery 142c of the minute concave-convex layer 142. It is preferred that the adhesive layer 103 be formed to have a predetermined space D from the organic layer 94 in a state that the adhesive layer 103 is not brought in contact with the organic layer 94. It is preferred that the distance D be, for example, 1 μm or longer. The adhesive layer 103 can be formed at a predetermined position by applying an adhesive by use of a scannable dispenser, a movable stage, and/or the like. Further, the adhesive layer 103 having a desired line width can be formed by controlling the scanning velocity of the dispenser and the discharge amount of the adhesive from the dispenser. Next, the sealing member 101 is disposed above the concave-convex structure layer 142, the first electrode 92, the organic layer 94, and the metal electrode 98 to face the base member 40 and then the sealing member 101 is allowed to being adhered (connected) to the base member 40 via the adhesive layer 103. Accordingly, the space 105 between the base member 40 and the sealing member 101 is sealed. Then the adhesive layer 103 is cured by being irradiated with energy rays when the adhesive layer 103 is made of a material which can be cured by being irradiated with energy rays. For example, when the adhesive layer 103 is made of the photocurable adhesive, the adhesive layer 103 is cured such that the light in a range from an ultraviolet region to a visible region which is obtained by a high-pressure mercury vapor lamp or a halogen lamp is radiated from the side of the sealing member or the side of the base member. When the adhesive layer 103 is made of the thermosetting adhesive, the adhesive layer 103 is cured by heating, for example, at a temperature of 50 to 150° C. Accordingly, the base member 40 and the sealing member 101 are formed integrally and thus the light emitting element 100, in which the organic layer 94 is disposed in the sealed space 105, is formed.

After formation of the organic layer 94, it is preferred that the organic layer 94 be sealed, for example, in a nitrogen atmosphere (e.g. by use of a glove box, the inside of which is replaced with high-purity nitrogen gas of not less than five-nines (99.999%) purity) without any contact with atmospheric air. In the above-described sealing step, the sealing member 101 is arranged after the adhesive layer 103 is formed on the base member 40. The adhesive layer 103, however, may be formed as follows. Namely, the sealing member 101 is arranged to face the base member 40 with a space intervening therebetween, and then an adhesive is injected into the space to form the adhesive layer 103.

In the sol-gel material coating step, the base member 40 may be coated with a dispersion liquid of fine particles such as $TiO_2$, ZnO, ZnS, ZrO, $BaTiO_3$, or $SrTiO_2$. Of the above materials, $TiO_2$ is preferably used in view of the film formation performance (coating property) and the refractive index. The coating film made of an inorganic material may be formed by a liquid phase deposition (LPD) or the like.

Alternatively, the base member 40 may be coated with a polysilazane solution in the sol-gel material coating step. In this case, a concave-convex structure layer made of silica may be obtained by forming the coating film made of the polysilazane solution into ceramic (silica reforming or modification) in the main baking step. It is noted that "polysilazane" is a polymer having a silicon-nitrogen bond, is an inorganic polymer comprising Si—N, Si—H, N—H, or the like, and is a precursor of a ceramics such as $SiO_2$, $Si_3N_4$, or $SiO_xN_y$, which is an intermediate solid solution of them. A compound, which is ceramized at relatively low temperature and is modified into silica, is more preferred. For example, a compound, which is represented by the following formula (1) described in Japanese Patent Application Laid-open No. H8-112879, is more preferable.

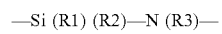

—Si (R1) (R2)—N (R3)—     Formula (1)

In the formula (1), R1, R2, and R3 each represent a hydrogen atom, an alkyl group, an alkenyl group, a cycloalkyl group, an aryl group, an alkylsilyl group, an alkylamino group, or an alkoxy group.

Of the compounds represented by the formula (1), perhydropolysilazane (referred to also as PHPS) in which all of R1, R2, and R3 are hydrogen atoms and organopolysilazane in which a part of the hydrogen bonded to Si thereof is substituted by, for example, an alkyl group are particularly preferred.

Other examples of the polysilazane ceramized at low temperature include: silicon alkoxide-added polysilazane obtained by reacting polysilazane with silicon alkoxide (for example, Japanese Patent Laid-Open No. 5-238827); glycidol-added polysilazane obtained by reaction with glycidol (for example, Japanese Patent Laid-open No. 6-122852); alcohol-added polysilazane obtained by reaction with alcohol (for example, Japanese Patent Laid-open No. 6-240208); metal carboxylate-added polysilazane obtained by reaction with metal carboxylate (for example, Japanese Patent Laid-Open No. 6-299118); acetylacetonato complex-added polysilazane obtained by reaction with an acetylacetonato complex containing a metal (for example, Japanese Patent Laid-Open No. 6-306329); metallic fine particles-added polysilazane obtained by adding metallic fine particles (for example, Japanese Patent Laid-Open No. 7-196986), and the like.

As a solvent of the polysilazane solution, it is possible to use hydrocarbon solvents such as aliphatic hydrocarbons, alicyclic hydrocarbons, and aromatic hydrocarbons; halogenated hydrocarbon solvents; and ethers such as aliphatic ethers and alicyclic ethers. Amine or a metal catalyst may be added in order to promote the modification into a silicon oxide compound.

The curing of polysilazane may be facilitated by heating or by irradiation with energy rays such as excimer.

The coating layer may be formed on the concave-convex structure layer 142. The coating layer can be formed by any of the methods which can be used to form the concave-convex structure layer 142. For example, the above-described sol-gel method, a method by use of a dispersion liquid of fine particles of an inorganic material, the liquid phase deposition (LPD), and a method of curing polysilazane may be used. When the silane coupling agent is used as the material of the coating layer, the coating layer may be formed as follows. Namely, the coating material is applied by any of various coating methods including, for example, a spin coating method, a spray coating method, a dip coating method, a dropping method, a gravure printing method, a screen printing method, a relief printing method, a die coating method, a curtain coating method, an ink-jet method, and a sputtering method. Then, the applied coating material is dried and cured under a proper condition suitable to the material used. For example, the coating material may be heat-dried at temperatures of 100° C. to 150° C. for 15 to 90 minutes.

EXAMPLES

In the following description, the present invention will be specifically explained with Examples and Comparative Examples. The present invention, however, is not limited to Examples. In each of Examples and Comparative Examples, a light emitting element was manufactured and then the evaluation of adhesion property of an adhesive layer of the light emitting element and the evaluation of deterioration under high humidity environment were performed.

Example 1

A mold having a concave-convex surface was manufactured as follows. At first, there was prepared a block copolymer produced by Polymer Source Inc., which was made of polystyrene (hereinafter referred to as "PS" in an abbreviated manner as appropriate) and polymethyl methacrylate (hereinafter referred to as "PMMA" in an abbreviated manner as appropriate) as described below.
Mn of PS segment=868,000
Mn of PMMA segment=857,000
Mn of block copolymer=1,725,000
Volume ratio between PS segment and PMMA segment (PS:PMMA)=53:47
Molecular weight distribution (Mw/Mn)=1.30
Tg of PS segment=96° C.
Tg of PMMA segment=110° C.

The volume ratio between the first polymer segment and the second polymer segment (the first polymer segment: the second polymer segment) in the block copolymer was calculated on the assumption that the density of polystyrene was 1.05 g/cm$^3$ and the density of polymethyl methacrylate was 1.19 g/cm$^3$. The number average molecular weights (Mn) and the weight average molecular weights (Mw) of polymer segments or polymers were measured by using a gel permeation chromatography (Model No. "GPC-8020" manufactured by TOSOH CORPORATION, in which TSKgel SuperH1000, SuperH2000, SuperH3000, and SuperH4000 were connected in series). The glass transition temperatures (Tg) of the polymer segments were measured by using a differential scanning calorimeter (manufactured by PERKIN-ELMER, INC. under the product name of "DSC7"), while the temperature was raised at a rate of temperature rise of 20° C./min over a temperature range of 0 to 200° C. The solubility parameters of polystyrene and polymethyl methacrylate were 9.0 and 9.3 respectively (see "Kagaku Binran Ouyou Hen" (Handbook of Chemistry, Applied Chemistry), 2nd edition).

Toluene was added to 150 mg of the block copolymer and 38 mg of Polyethylene Glycol 4000 manufactured by Tokyo Chemical Industry Co., Ltd. (Mw=3000, Mw/Mn=1.10) as polyethylene oxide so that the total amount thereof was 10 g, followed by dissolving them. Then, the solution was filtrated or filtered through a membrane filter having a pore diameter of 0.5 μm to obtain a block copolymer solution. The obtained block copolymer solution was applied, on a polyphenylene sulfide film (TORELINA manufactured by TORAY INDUSTRIES, INC.) as a base member to form a thin film having a thickness of 200 to 250 nm, by spin coating. The spin coating was performed at a spin speed of 500 rpm for 10 seconds and then a spin speed of 800 rpm for 30 seconds. The thin film formed by the spin coating was left at room temperature for 10 minutes until the thin film was dried.

Then, the base member on which the thin film was formed was subjected to a solvent annealing process by being stationarily placed in a desiccator filled with chloroform vapor in advance at room temperature for 24 hours. Inside the desiccator (volume: 5 L), a screw-type container charged with 100 g of chloroform was placed, and the atmosphere inside the desiccator was filled with chloroform at the saturated vapor pressure. Concavities and convexities were observed in the surface of the thin film after the solvent annealing process, and it was found that the block copolymer forming the thin film underwent the micro phase separation.

About 20 nm of a thin nickel layer was formed as a current seed layer by performing the sputtering on the surface of the thin film processed to have the wave-like shape by the solvent annealing process as described above. Subsequently, the base member equipped with the thin film was immersed in a nickel sulfamate bath and subjected to an electroforming process (maximum current density: 0.05 A/cm$^2$) at a temperature of 50° C. so as to precipitate nickel until the thickness became 250 μm. The base member equipped with the thin film was mechanically peeled off or released from the nickel electroforming body obtained as described above. Subsequently, the nickel electroforming body was immersed in a tetrahydrofuran solvent for 2 hours, and then the nickel electroforming body was coated with an acrylic-based UV curable resin, followed by being cured and peeled off. This process was repeated three times, and thus polymer component(s) adhered to a part of the surface of the electroforming body was (were) removed. After that, the nickel electroforming body was immersed in Chemisol 2303 manufactured by THE JAPAN CEE-BEE CHEMICAL CO., LTD., and was cleaned or washed while being stirred or agitated for 2 hours at 50° C. Thereafter, the UV ozone treatment was applied to the nickel electroforming body for 10 minutes.

Subsequently, the nickel electroforming body was immersed in OPTOOL HD-2100TH manufactured by DAI-KIN INDUSTRIES, ltd. for about 1 minute and was dried, and then stationarily placed overnight. The next day, the nickel electroforming body was immersed in OPTOOL HD-TH manufactured by DAIKIN INDUSTRIES, ltd. and was subjected to an ultrasonic cleaning (washing) process for about 1 minute. In such a manner, a nickel mold (nickel substrate) for which a mold-release treatment had been performed was obtained.

Subsequently, a PET substrate (COSMOSHINE A-4100, easy adhesion PET film manufactured by TOYOBO CO., LTD.) was coated with a fluorine-based UV curable resin. The fluorine-based UV curable resin was cured by irradiation with ultraviolet light at 600 mJ/cm$^2$ while the nickel mold was pressed thereagainst. After curing of the resin, the nickel mold was exfoliated or peeled off from the cured resin. Accordingly, a diffraction grating mold, which was composed of the PET substrate with the resin film to which the surface profile (surface shape) of the nickel mold was transferred, was obtained.

Figure 6A:
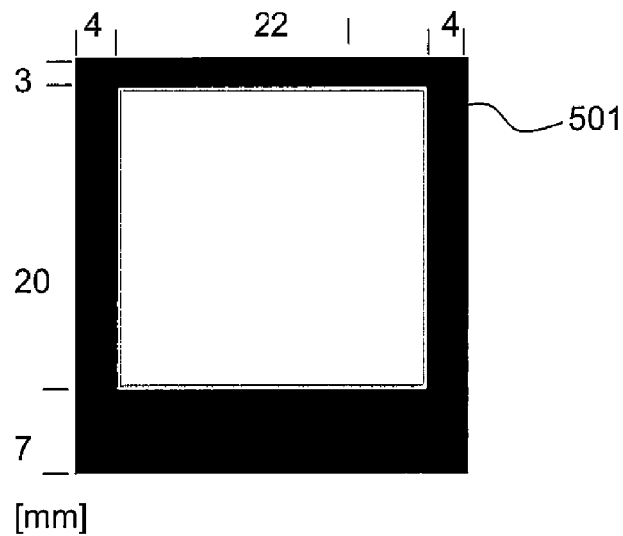

The light emitting element was manufactured by using the mold thus obtained. As the base member of the light emitting element, an alkali-free glass of 30 mm×30 mm×0.07 (thickness) mm (produced by Nippon Electric Glass Co., Ltd.) was prepared. The base member was scrubbed and cleaned by using a cleanser (RBS-25, produced by Junsei Chemical Co., Ltd.) and a sponge sufficiently, and then a concave-convex structure layer was formed thereon by the liftoff method as follows. Namely, the base member was coated with a positive resist (OFPR-800, produced by TOKYO OHKA KOGYO Co., LTD.) by spin coating such that the positive resist had a thickness of about 1 μm, and then predrying was performed at a temperature of 80° C. for 30 minutes. Exposure was performed with UV light (λ=365 nm) for 16 seconds by using the mask 501 as depicted in FIG. 6A. In FIG. 6A, the white portion is a light transmissive portion, the mask 501 is marked with scales, and respective lengths are represented in numbers to show sizes thereof Subsequently, the positive resist on the base member was developed by using an organic developer (MFCD-26, produced by Shipley Co. Llc.) and was washed with running water for 3 minutes. Then, drying was performed at a temperature of 100° C. for 10 minutes. A resist remained on a portion, on the base member, corresponding to a light-shielding portion (black portion) of the mask 501.

Subsequently, a sol-gel material to be used as the material of the concave-convex structure layer was prepared as follows. Namely, 2.5 g of tetraethoxysilane (TEOS) and 2.1 g of methyltriethoxysilane (MTES) were added dropwise to a mixture solution of 24.3 g of ethanol, 2.16 g of water, and 0.0094 g of concentrated hydrochloric acid, followed by being stirred or agitated for 2 hours at a temperature of 23° C. and a humidity of 45%.

The surface, on the transparent substrate, formed with the patterned resist was coated with the sol-gel material by spin coating. The spin coating was performed for 8 seconds at rotation speed of 500 rpm, and then for 3 seconds with rotation speed of 1000 rpm.

After the elapse of 60 seconds from the spin coating of the sol-gel material, the mold obtained as described above was pressed against the coating film made of the sol-gel material on the base member by use of the pressing roll heated to 80° C. while the pressing roll was moved and rotated. Then, the surface, of the mold, on which the minute concave-convex pattern had been formed was pressed against the coating film on the base member while the pressing roll at 80° C. was being rotated from one end to the other end of the base member. After the pressing with the mold, the mold was manually released or peeled off from the one end to the other end of the base member such that the angle (peel angle) of the mold with respect to the base member was about 30°. As the pressing roll, it was used a roll which included a heater therein and had the outer circumference covered with heat-resistant silicon of a thickness of 4 mm, the roll having a diameter (φ) of 50 nm and a length of 350 mm in an axial direction of the shaft.

Subsequently, the concave-convex structure layer was subjected to the main baking by being heated for 60 minutes in an oven of 300° C.

Subsequently, the resist was stripped or peeled off by using a resist stripping liquid (Resist Strip N-320, produced by Nagase Sangyo K. K.). The resist and the sol-gel film on the resist were removed, and the sol-gel film remained on a portion corresponding to the white portion (light transmissive portion) of the mask 501 depicted in FIG. 6A. Namely, the concave-convex structure layer made of the sol-gel material was formed in an area inside a rectangle of 22 mm×20 mm, which was apart from two sides, of the base member, facing each other (hereinafter referred to as "left and right sides" as appropriate) by a distance of 4 mm, apart from one of remaining two sides (hereinafter referred to as "upper side" as appropriate) by a distance of 3 mm, and apart from the remaining one side (hereinafter referred to as "lower side" as appropriate) by a distance of 7 mm.

Figure 7:
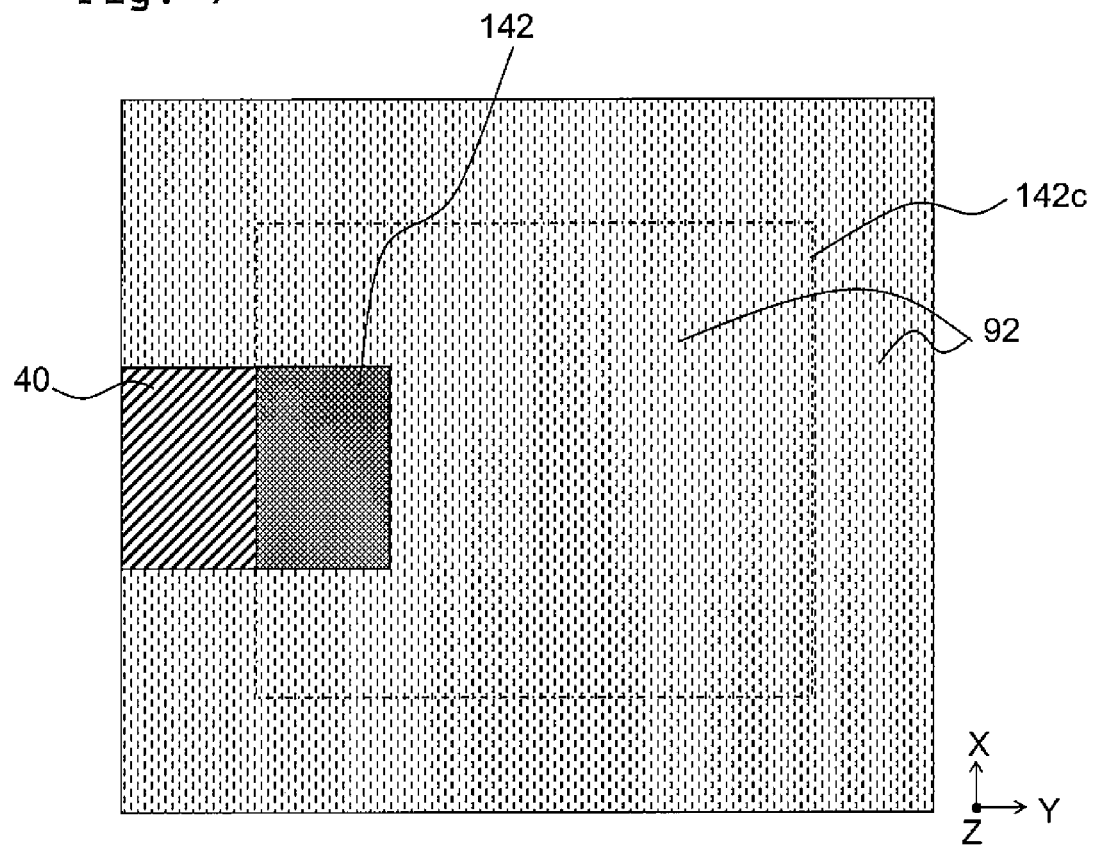
FIG. 7 is a schematic top view of a substrate with a first electrode formed in Example 1.

The base member with the pattern made of the concave-convex structure layer obtained as described above was cleaned with a brush to remove foreign matter and the like adhered thereto, then organic matter and the like was removed by an alkaline cleaner and an organic solvent. On the base member cleaned as described above, an ITO film having a thickness of 120 nm was formed at a temperature of 300° C. by a sputtering method. Photoresist was applied on the ITO film and exposure was performed with a mask pattern for a transparent electrode (first electrode), and then the resist was developed with a developer and ITO was etched with an etching solution. Accordingly, a transparent electrode having a pattern as depicted in the schematic top view of FIG. 7 was obtained. The obtained transparent electrode was cleaned with a brush, and organic matter and the like was removed by an alkaline cleaner and an organic solvent. Then, the transparent electrode was subjected to a UV-ozone process. On the transparent electrode processed as described above, a hole transporting layer (4,4',4"tris(9-carbazole)triphenylamine, thickness: 35 nm), an organic layer (tris(2-phenylpyridinato)iridium(III) complex-doped 4,4',4"tris(9-carbazole)triphenylamine, thickness: 15 nm; tris(2-phenylpyridinato)iridium(III) complex-doped 1,3,5-tris(N-phenylbenzimidazole-2-yl)benzene, thickness: 15 nm), an electron transporting layer (1,3,5-tris(N-phenylbenzimidazole-2-yl)benzene, thickness: 65 nm), and a lithium fluoride layer (thickness: 1.5 nm) were each stacked by a vapor deposition method, and further a metal electrode (second electrode) (aluminum, thickness: 50 nm) was formed by the vapor deposition method.

The base member, in which the concave-convex structure layer, the transparent electrode, the organic layer, and the metal electrode were formed, was moved from a vacuum apparatus into a glove box under $N_2$ atmosphere and adhesive (UV RESIN XNR 5516Z, produced by Nagase ChemteX Corporation) was applied on the base member. The adhesive layer was formed by using a dispenser robot (SHOTMASTER300, produced by Musashi Engineering Inc.) while the applying position of the adhesive, scanning velocity of the dispenser robot, and the amount of the applied adhesive were controlled. The adhesive layer was formed to have a belt or band shape having 4 mm in width and extending along the circumference of the rectangle of 22 mm×20 mm as the center (center line), the circumference of the rectangle being apart from the left and right sides of the base member by a distance of 4 mm, apart from the upper side by a distance of 3 mm, and apart from the lower side by a distance of 7 mm. (That is, the adhesive layer was formed to have a 4 mm-wide belt or band shape extending along the outer periphery of the concave-convex structure layer as the center line.)

An engraved glass (alkali-free glass, produced by NSG Precision Co., Ltd.) of 26 mm×30 mm which had a concave portion of 18 mm x 16 mm was processed with UV-$O_3$ for 3 minutes. The engraved glass was placed on the base member such that the concave portion of the engraved glass faced the base member and the center (center line) of the width of the convex portion of the engraved glass overlapped the applied adhesive line. The base member was pressed against the engraved glass by using a clip (small binder clip, produced by Lion Corporation) sandwiching them, and then the clip was removed. The adhesive layer was cured by being irradiated with UV light at a totalized light quantity of 600 mJ/cm$^2$ by use of a UV radiation light source (LIGHTNING CURE LC8, produced by Hamamatsu Photonics K.K.). The engraved glass was designed to include protruding part extending beyond the upper side of the base member by 5 mm when being placed on the base member in the above-described manner.

The sealed light emitting element was obtained through the above procedure. FIGS. 1A and 1B schematically depict a planer structure and a cross-sectional structure of the manufactured light emitting element, respectively.

Example 2

In Example 1, the resist pattern was formed to perform the patterning of the concave-convex structure layer by means of photolithography using the positive resist. In Example 2, the method for forming the resist pattern was changed as described below, and along with this, the method for stripping the resist was also changed. A light emitting element was manufactured in a similar manner to Example 1 except for the above. FIG. 2 schematically depicts a cross-sectional structure of the light emitting element manufactured in Example 2.

Figure 6B:
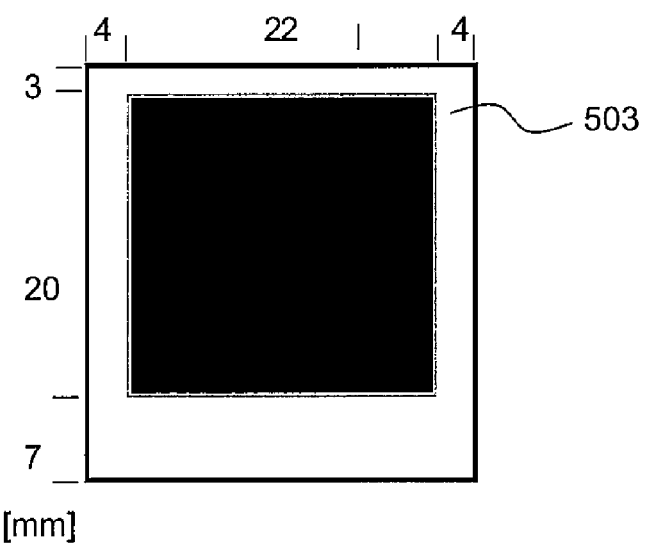

A negative resist prepared as described below was used as the resist. Namely, 100 parts of methacrylic acid-methyl methacrylate copolymer in which the composition ratio (molar ratio) of methacrylic acid and methyl methacrylate was 20:80 and the weight average molecular weight thereof was 30,000; 6 parts of pentaerythritol tetraacrylic ester; 2 parts of Michler's Ketone; and 2 parts of 4-(4-dimethylaminophenylazo)-phenol were dissolved in 330 parts of a mixed solvent in which ethyl cellosolve acetate/ethyl cellosolve was 60/40. Then, the obtained solution was filtrated or filtered through a membrane filter of 0.22 μm. The base member was coated with the negative resist by spin coating such that the negative resist had a thickness of about 1 μm, and then predrying was performed at a temperature of 90° C. for 60 seconds. Exposure was performed by using a mask 503 depicted in FIG. 6B and a contact exposure apparatus (PLA501F, produced by Canon Inc.) in which the illumination ratio of g-line/i-line was 7/5 (mW/cm$^2$) at an intensity of 130 mJ/cm$^2$. In FIG. 6B, the white portion is a light transmissive portion, the mask 503 is marked with scales, and respective lengths are represented in numbers to show sizes thereof. Subsequently, paddle development with 0.5% NaOH solution was performed for 60 seconds. Further, the resist pattern was baked and hardened by being irradiated with UV light (wavelength: 254 nm, illuminance: 1.2 mW/cm$^2$) by use of a high-pressure mercury vapor lamp for 200 seconds. The resist formed in the part, in which light was blocked by the mask 503, was removed.

After performing the preparation of the sol-gel material to be used for the concave-convex structure layer, coating, the pressing with the mold, and main baking in a similar manner to Example 1, the resist pattern was stripped by swinging the base member in a resist stripping liquid which was dimethylsulfoxide warmed or heated to 50° C., cleaning the base member with isopropyl alcohol, and drying the base member. Further, the base member was washed with running water and dried. The resist and the sol-gel film on the resist were removed, so that the concave-convex structure layer made of the sol-gel material was formed only on the portion corresponding to the black portion (light shielding portion) of the mask 503 depicted in FIG. 6B. The base member having the concave-convex structure layer was observed by SEM (SU1510 manufactured by HITACHI High-Technologies Corporation). As a result, an angle θ, which was formed by the surface of the base member and the outer periphery (side surface) of the minute concave-convex structure layer, was 70° (see FIG. 2).

Example 3

A light emitting element was manufactured in a similar manner to Example 1 except that the concave-convex structure layer was formed as described below by the UV curing method using a UV curable resin instead of the lift-off method. FIGS. 1A and 1B schematically depict a planer structure and a cross-sectional structure of the manufactured light emitting element, respectively.

1 g of silane coupling agent (KBM-5103 produced by SHIN-ETSU CHEMICAL, CO., LTD.) was added dropwise to a mixture of 1 g of water, 19 g of IPA, and 0.1 mL of acetic acid while the mixture was being stirred. After that, this mixture solution was stirred for another hour, thereby preparing a solution of the silane coupling agent. The base member was cleaned in a similar manner to Example 1, and then moisture on a surface of the base member was removed by drying using spin coater. The surface of the base member after the drying was coated with the solution of the silane coupling agent by spin coating. The spin coating was performed at a spin speed of 1000 rpm for 30 seconds. After that, the base member was baked in an oven of 130° C. for 15 minutes. The base member to which the easy-adhesion treatment had been performed was obtained, accordingly. The easy-adhesion treatment surface of the base member to which the easy-adhesion treatment had been performed was coated with a UV curable resin (PAK-02 produced by Toyo Gosei CO., Ltd.) by spin coating. The spin coating was performed at a spin speed of 1000 rpm for 30 seconds. A diffraction grating mold, which was similar to that used in Example 1, was pressed against the coated UV curable resin using a hand roller. Further, the mask 501 depicted in FIG. 6A was superposed on the mold, and the UV curable resin positioned in the light transmissive portion of the mask 501 was cured by being irradiated with UV light at 600 mJ/cm$^2$ from the side of the mask. After the mask and mold were released from the base member, uncured resin was cleaned or washed with IPA and the base member was dried by means of a nitrogen blow. Accordingly, the concave-convex structure layer made of the UV curable resin which had a similar structure as that of the concave-convex structure layer made of the sol-gel material in Example 1 was formed.

Example 4

A light emitting element was manufactured in a similar manner to Example 1 except that a gas barrier film was used as the base member and the concave-convex structure layer was formed as described below by the UV curing method using a UV curable resin instead of the lift-off method. FIGS. 1A and 1B schematically depict a planer structure and a cross-sectional structure of the manufactured light emitting element, respectively.

1 g of silane coupling agent (KBM-5103 produced by SHIN-ETSU CHEMICAL, CO., LTD.) was added dropwise to a mixture of 1 g of water, 19 g of IPA, and 0.1 mL of acetic acid while the mixture was being stirred. After that, this mixture solution was stirred for another hour, thereby preparing a solution of the silane coupling agent. As the base member, the gas barrier film obtained in the following manner was used. Namely, a SiOxNy (x, y=0 to 2) film, which was made of an organic-inorganic hybrid material composed of an organic constituent and an inorganic constituent, was formed as a barrier film on a PEN base member (TeonexQ65F produced by Teijin DuPont Films Japan Limited) having a film thickness of 200 μm. The water vapor transmission rate of this gas barrier film was not more than 1×10⁻³g/m²/day. The barrier film of the gas barrier film was coated with the solution of the silane coupling agent by spin coating. The spin coating was performed at a spin speed of 1000 rpm for 30 seconds. After that, the base member was baked in an oven of 130° C. for 15 minutes. The base member with the gas barrier film to which the easy-adhesion treatment had been performed was obtained, accordingly. The easy-adhesion treatment surface of the gas barrier film to which the easy-adhesion treatment had been performed was coated with a UV curable resin (PAK-02 produced by Toyo Gosei Co., Ltd.) by spin coating. The spin coating was performed at a spin speed of 1000 rpm for 30 seconds. A diffraction grating mold, which was similar to that used in Example 1, was pressed against the coated UV curable resin using a hand roller. Further, the mask 501 depicted in FIG. 6A was superposed on the mold, and the UV curable resin positioned in the light transmissive portion of the mask 501 was cured by being irradiated with UV light at 600 mJ/cm² from the side of the mask. After the mask and mold were released from the base member, uncured resin was cleaned or washed with IPA and the base member was dried by means of a nitrogen blow. Accordingly, the concave-convex structure layer made of the UV curable resin which had a similar structure as that of the concave-convex structure layer made of the sol-gel material in Example 1 was formed on the base member with the gas barrier film.

Comparative Example 1

Figure 8:
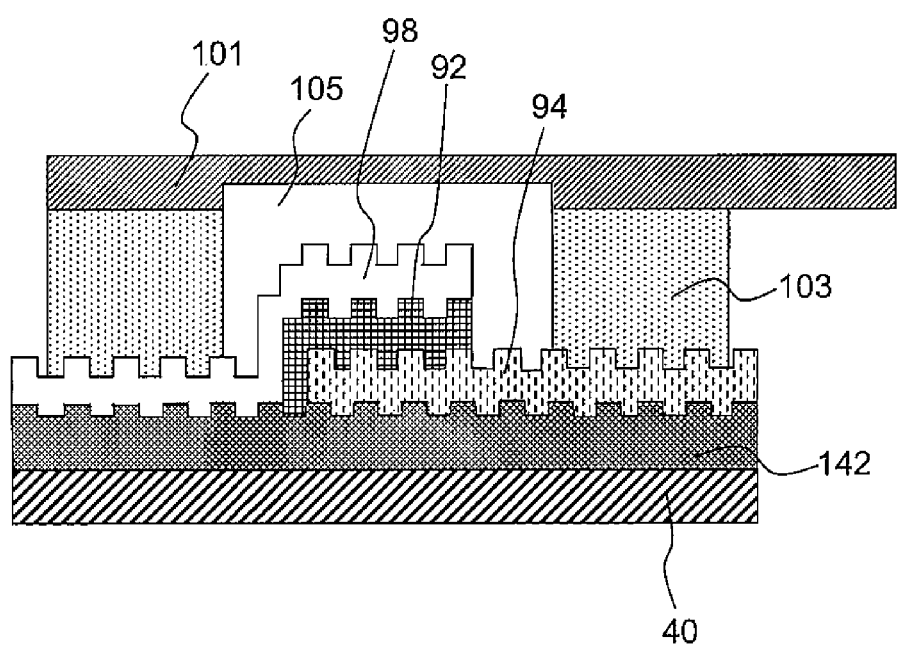
FIG. 8 is a schematic cross-sectional view of a light emitting element of Comparative Example 1.

In Example 1, the patterning of the concave-convex structure layer was performed by photolithography using the positive resist. In Comparative Example 1, a light emitting element was manufactured in a similar manner to Example 1 except that the photolithography using the positive resist was not performed. As for the light emitting element manufactured in Comparative Example 1, the concave-convex structure layer was formed on the entire surface on the base member, and thus a structure in which the concave-convex structure layer was exposed to the outside of the adhesive layer was obtained. FIG. 8 schematically depicts its cross-sectional structure.

Comparative Example 2

Figure 6C:
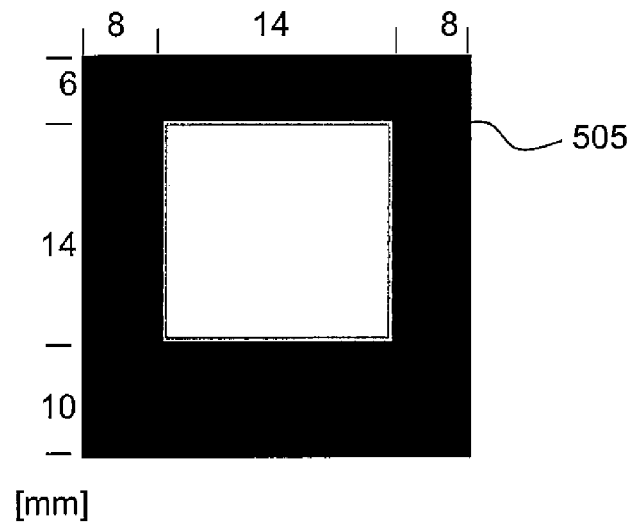
Figure 9:
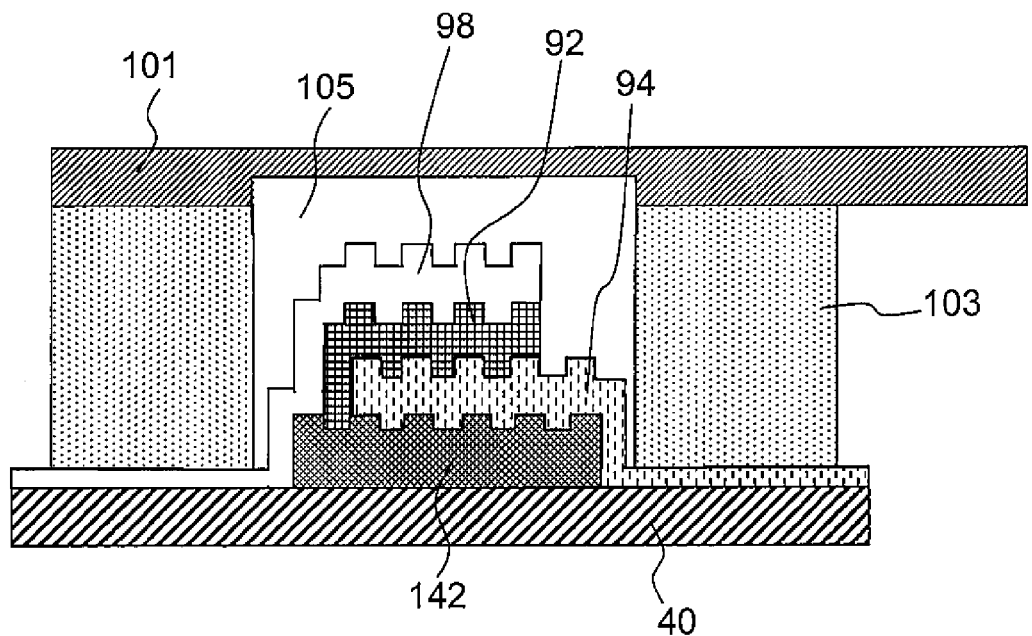
FIG. 9 is a schematic cross-sectional view of a light emitting element of Comparative Example 2.

In Example 1, the patterning of the concave-convex structure layer was performed by photolithography using the mask 501 depicted in FIG. 6A. In Comparative Example 2, photolithography was performed by using a mask 505 depicted in FIG. 6C instead of the mask 501. In FIG. 6C, the white portion is a light transmissive portion, the mask 505 is marked with scales, and respective lengths are represented in numbers to show sizes thereof. A light emitting element was manufactured in a similar manner to Example 1 except for the above. As for the manufactured light emitting element, the outer periphery of the concave-convex structure layer was positioned inside the inner circumference of the adhesive layer. FIG. 9 schematically depicts its cross-sectional structure.

Comparative Example 3

In Example 4, irradiation with UV light by use of the mask 501 depicted in FIG. 6A was performed. In Comparative Example 3, irradiation with UV light was performed without the mask 501. Further, in Example 4, uncured resin was cleaned with IPA and the base member was dried by means of the nitrogen blow after the irradiation with UV light. In Comparative Example 3, however, those performed after the irradiation with UV light in Example 4 were not performed. A light emitting element was manufactured in a similar manner to Example 4 except for the above. As for the light emitting element manufactured in Comparative Example 3, the concave-convex structure layer was formed on the entire surface on the base member, and thus a structure in which the concave-convex structure layer was exposed to the outside of the adhesive layer was obtained. FIG. 8 schematically depicts its cross-sectional structure.

[Evaluation of Adhesion Property]

Figure 10:
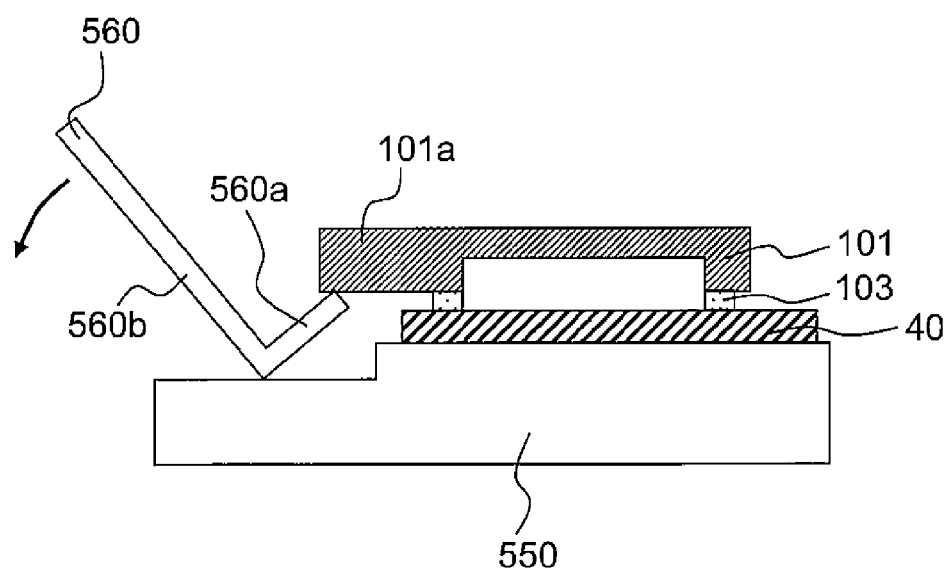
FIG. 10 schematically depicts a method for evaluating the adhesion property of an optical element manufactured in each of Examples and Comparative Examples.

Regarding the light emitting element manufactured in each of Examples 1 to 3 and Comparative Examples 1 and 2, the adhesion property of the adhesion layer was evaluated as follows. Namely, as depicted in FIG. 10, the light emitting element was fixed to a stand (base) 500 and a plate-like L-shape tool 560 (20 mm in depth), of which cross section was L-shape (a short side 560a having a length of 7 mm, a long side 560b having a length of 15 mm), was inserted under a protruding part 101a of an engraved glass 101. Then, the protruding part 101a of the engraved glass 101 was pushed up by pushing the long side 560b of the L-shape tool downward in the direction indicated by the arrow in FIG. 10 with the corner of the L-shape tool 560 as the point of action of a lever. When the engraved glass 101 together with the adhesive layer 103 was separated from or peeled off from the upper surface of the base member 40, the light emitting element was evaluated to be unsatisfactory or defective; and when the engraved glass 101 was broken and the adhesive layer 103 remained adhering to the upper surface of the base member 40, the light emitting element was evaluated to be satisfactory. The test was performed for ten light emitting elements manufactured in each of Examples 1 to 3 and Comparative Examples 1 and 2. The number of defective light emitting elements is indicated in the table of FIG. 11. Regarding Examples 1 to 3 and Comparative Example 1, all of the ten light emitting elements were evaluated as satisfactory. In Comparative Example 2, five light emitting elements, of the ten light emitting elements tested, were evaluated as unsatisfactory. From these results, the light emitting element manufactured in each of Examples 1 to 3 and Comparative Example 1 had a better adhesion property of the lower surface of the adhesive layer than that of the light emitting element manufactured in Comparative Example 2. The reason thereof is considered as follows. Namely, the lower surface of the adhesive layer in Comparative Example 2 was in contact only with the flat surface, but in Examples 1 to 3 and Comparative Example 1, the lower surface of the adhesive layer was in contact with the concave-convex surface. Thus, "catching" and the like obtained by concavities and convexities made mechanical releasing (mechanical exfoliation) more difficult, and concavities and convexities increased an interface area. Such effects strengthened the adhesive force.

[Deterioration Evaluation]

A deterioration test was performed for the light emitting element manufactured in each of Examples 1 to 4 and Comparative Examples 1 to 3 under high humidity environment as described below. A voltage of 4 V was applied to the light emitting element in an initial state, and the number of dark spots in a light emitting area of 14 mm×14 mm was counted. Next, the light emitting element was kept in a thermohygrostat with a temperature of 40° C. and a humidity of 90%. 10 days and 20 days after the putting of the light emitting element in the thermohygrostat, a voltage of 4 V was applied to the light emitting element and the number of dark spots in the light emitting area of 14 mm×14 mm was counted. Each of the results is shown in the table of FIG. 11. Regarding Examples 1 to 4 and Comparative Example 2, the number of dark spots did not increase, that is, the number thereof was zero. Regarding Comparative Example 1, the number of dark spots increased to 3 in 10 days and increased to 15 in 20 days. Regarding Comparative Example 3, the number of dark spots increased to 5 in 10 days and increased to 20 in 20 days. From these results, it has been revealed that the light emitting elements manufactured in Examples 1 to 4 and Comparative Example 2 were less likely to deteriorate than the light emitting elements manufactured in Comparative Examples 1 and 3. The reason thereof is considered as follows. Namely, the concave-convex structure layer of the light emitting element manufactured in each of Comparative Examples 1 and 3 was exposed to the outside (atmospheric air) of the adhesive layer, and thus moisture and oxygen entered the sealed space via the concave-convex structure layer. The concave-convex structure layer of the light emitting element manufactured in each of Examples 1 to 4 and Comparative Example 2 was not exposed to the outside (atmospheric air) of the adhesive layer, and thus moisture and oxygen were prevented from penetrating through the concave-convex structure layer and entering the sealed space.

Although the present invention has been explained as above with the embodiment, Examples, and Comparative Examples, the light emitting element and the method for producing the light emitting element of the present invention are not limited to the above-described embodiment etc., and may be appropriately modified or changed within the range of the technical ideas described in the following claims. For example, although the transparent electrode (first electrode) is formed to approximately or substantially cover the concave-convex structure layer in the embodiment and Examples, the arrangement and shape of the first electrode are not limited to this. The adhesive layer may adhere to a part of the concave-convex structure layer instead of a part of the first electrode, or the adhesive layer may adhere to both of a part of the first electrode and a part of the concave-convex structure layer such that the adhesive layer extend thereacross. In any case, since the adhesive layer adheres to the concave-convex structure of the concave-convex structure layer or the concave-convex surface of the first electrode which reflects or shows the concave-convex structure of the concave-convex structure layer, the adhesive force between the adhesive layer and the base member improves.

The light emitting element of the present invention includes the concave-convex structure layer functioning as the diffraction grating, and thus light-emitting property thereof is excellent. Further, the light emitting part is sealed by the frame sealing having sufficient sealing performance. Thus, the deterioration of the light emitting part due to invading moisture and oxygen is prevented, the occurrence of any defect such as dark spots is reduced, and the light emitting element has a long service life. Therefore, the light emitting element of the present invention is very useful in various light-emitting devices.

What is claimed is:

1. A light emitting element comprising:
   a base member;
   a sealing member disposed to face the base member;
   a concave-convex structure layer;
   a first electrode;
   an organic layer;
   a second electrode; and
   an adhesive layer,
   wherein the concave-convex structure layer, the first electrode, the Organic layer, and the second electrode are formed on the base member in that order;
   the adhesive layer is positioned between the base member and the sealing member;
   an outer periphery of the concave-convex structure layer is positioned between an inner periphery of the adhesive layer and an outer periphery of the adhesive layer;
   at least one of the first electrode and the second electrode includes an overlapping part overlapping both of the concave-convex structure layer and the adhesive layer;
   the overlapping part has a concave-convex surface reflecting or showing concavities and convexities of the concave-convex structure layer; and
   the inner periphery of the adhesive layer adheres to the concave-convex surface of the first electrode or the second electrode.

2. The light emitting element according to claim 1, wherein the organic layer is positioned such that a predetermined space is provided between the adhesive layer and the organic layer.

3. The light emitting element according to claim 1, wherein the outer periphery of the concave-convex structure layer is formed as an inclined surface, and an angle between the outer periphery of the concave-convex structure layer and a surface of the base member is not more than 80°.

4. The light emitting element according to claim 1, wherein a space, which is sealed by the base member, the sealing member disposed to face the base member, and the adhesive layer, is filled with infilling.

5. The light emitting element according to claim 1, wherein the concave-convex structure layer is made of a sol-gel material.

6. The light emitting element according to claim 1, wherein a concave-convex pattern, of the concave-convex structure layer, which is positioned on a lower side of the organic layer is different from a concave-convex pattern, of the concave-convex structure layer, which is positioned on a lower side of the adhesive layer.

7. A method for manufacturing a light emitting element, comprising:
   forming a concave-convex structure layer on a base member;
   forming a first electrode on the concave-convex structure layer;
   forming an organic layer on the first electrode;
   forming a second electrode on the organic layer; and
   disposing a sealing member to face the base member such that the concave-convex structure layer, the first electrode, the organic layer, and the second electrode, those of which are formed on the base member, are positioned between the base member and the sealing member; and forming an adhesive layer between the base member and the sealing member,
   wherein the adhesive layer is formed such that an outer periphery of the concave-convex structure layer is positioned between an inner periphery of the adhesive layer and an outer periphery of the adhesive layer;
   at least one of the first electrode and the second electrode includes an overlapping part both of the concave-convex structure layer and the adhesive layer;
   the overlapping part has a concave-convex surface reflecting or showing concavities and convexities of the concave-convex structure layer; and
   the inner periphery of the adhesive layer adheres to the concave-convex surface of the first electrode or the second electrode.

8. The method for manufacturing the light emitting element according to claim 7, wherein the adhesive layer is formed in a position in which the adhesive layer has no contact with the organic layer.

9. The method for manufacturing the light emitting element according to claim 7, wherein the concave-convex structure layer is formed such that an angle between the outer periphery of the concave-convex structure layer and a surface of the base member is not more than 80°.

* * * * *